(12) United States Patent
Fukuda et al.

(10) Patent No.: US 11,663,562 B2
(45) Date of Patent: May 30, 2023

(54) SUBSTRATE PROCESSING APPARATUS AND CONTROLLER

(71) Applicant: KOKUSAI ELECTRIC CORPORATION, Tokyo (JP)

(72) Inventors: Mitsuru Fukuda, Toyama (JP); Risa Hosokawa, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 820 days.

(21) Appl. No.: 16/128,851

(22) Filed: Sep. 12, 2018

(65) Prior Publication Data

US 2019/0012847 A1 Jan. 10, 2019

Related U.S. Application Data

(63) Continuation of application No. PCT/JP2016/057973, filed on Mar. 14, 2016.

(51) Int. Cl.
*G06Q 10/20* (2023.01)
*G05B 19/4065* (2006.01)
(Continued)

(52) U.S. Cl.
CPC ........... *G06Q 10/20* (2013.01); *G05B 19/409* (2013.01); *G05B 19/4065* (2013.01);
(Continued)

(58) Field of Classification Search
CPC .......... G06Q 10/20; G05B 2219/32234; G05B 19/4065; G05B 23/0283
See application file for complete search history.

(56) References Cited

U.S. PATENT DOCUMENTS 6,138,056 A * 10/2000 Hardesty ............ G05B 19/4063
700/174
7,502,744 B2 * 3/2009 Garrow .................. G06Q 10/06
705/1.1
(Continued)

FOREIGN PATENT DOCUMENTS

JP 2000-124094 A 4/2000
JP 3300816 B2 7/2002
(Continued)

OTHER PUBLICATIONS

Kwon, O. (2011). A study of evaluation methods centered on reliability for renewal of aging hydropower plants (Order No. 1491192). Available from ProQuest Dissertations and Theses Professional. (864737826). (Year: 2011).*
(Continued)

*Primary Examiner* — Maria C Santos-Diaz
(74) *Attorney, Agent, or Firm* — Volpe Koenig

(57) ABSTRACT

There is provided a configuration at least including a screen control part configured to display on a display part a maintenance component management screen displaying a component, a mechanism, or both, as a maintenance component, a collection part configured to collect component data related to the maintenance component, a determination part configured to compare a cumulative value of the component data with a predetermined threshold value to determine the cumulative value exceeding the threshold value, a calculation part configured to calculate a replacement time, and an operation part configured to calculate replacement times based on an average value of the component data and a cumulative value of the component data for each predetermined cycle, display the maintenance component sequentially from the maintenance component reaching the earliest replacement time, and display the maintenance component (Continued)

on the display part in a state where the component data is updated for the predetermined cycle.

10 Claims, 18 Drawing Sheets

(51) Int. Cl.
  *G07C 3/00*   (2006.01)
  *G07C 3/06*   (2006.01)
  *H01L 21/67*   (2006.01)
  *G05B 23/02*   (2006.01)
  *G05B 19/409*   (2006.01)

(52) U.S. Cl.
  CPC ......... *G05B 23/0283* (2013.01); *G07C 3/005* (2013.01); *G07C 3/06* (2013.01); *H01L 21/67178* (2013.01); *H01L 21/67253* (2013.01); *H01L 21/67276* (2013.01); *H01L 21/67288* (2013.01); *G05B 2219/32234* (2013.01); *G05B 2219/45031* (2013.01); *G05B 2219/45045* (2013.01)

(56) References Cited

U.S. PATENT DOCUMENTS

| | | | | |
|---|---|---|---|---|
| 7,987,108 B2* | 7/2011 | Wetzer | ............... | G05B 23/0283 705/7.12 |
| 8,655,698 B2* | 2/2014 | West, II | ......... | G06Q 10/063112 705/7.12 |
| 9,218,694 B1* | 12/2015 | Kipersztok | ............ | G06Q 10/20 |
| 10,295,991 B2* | 5/2019 | Yoneda | ............. | H01L 21/67276 |
| 2003/0115020 A1* | 6/2003 | Adachi | .............. | G05B 23/0283 702/184 |
| 2003/0182014 A1* | 9/2003 | McDonnell | ........ | G05B 19/4065 700/159 |
| 2004/0148136 A1* | 7/2004 | Sasaki | ................ | G05B 19/4065 702/184 |
| 2004/0186607 A1* | 9/2004 | Yoshinaga | .............. | B29C 45/76 700/109 |
| 2005/0004821 A1* | 1/2005 | Garrow | ................ | G06Q 10/087 705/7.11 |
| 2008/0103715 A1* | 5/2008 | Tsuda | ....................... | G07C 3/00 702/81 |
| 2008/0215628 A1* | 9/2008 | Adachi | ................ | G06Q 30/014 |
| 2009/0089076 A1* | 4/2009 | Asakimori | ......... | H04N 1/00832 705/305 |
| 2010/0064235 A1* | 3/2010 | Walls | ..................... | G06Q 10/08 715/763 |
| 2013/0007593 A1* | 1/2013 | Ichimi | ................ | G06F 16/9577 715/234 |
| 2014/0156057 A1* | 6/2014 | Tong | .................. | G05B 19/4065 700/175 |
| 2014/0257530 A1* | 9/2014 | Misoka | ................ | G05B 19/406 700/79 |
| 2016/0034329 A1* | 2/2016 | Larson | .................. | G06F 11/008 702/188 |
| 2017/0153625 A1* | 6/2017 | Yamamoto | ......... | G05B 19/4063 |
| 2017/0161622 A1* | 6/2017 | Kung | .................... | G06N 20/00 |
| 2017/0161628 A1* | 6/2017 | Chiba | ................... | G06F 40/103 |
| 2017/0178015 A1* | 6/2017 | Sato | ....................... | G06N 7/005 |
| 2018/0051442 A1* | 2/2018 | Igarashi | ................ | E02F 9/2054 |

FOREIGN PATENT DOCUMENTS

| | | |
|---|---|---|
| JP | 2003-257808 A | 9/2003 |
| JP | 2005-195401 A | 7/2005 |
| JP | 2008-127129 A | 6/2008 |
| JP | 2012-123311 A | 6/2012 |

OTHER PUBLICATIONS

Japanese Office Action dated May 22, 2019 for the Japanese Patent Application No. 2018-505071.
International Search Report, PCT/JP2016/057973, dated May 24, 2016, 2 pgs.
Chinese Office Action dated Sep. 21, 2022 for Chinese Patent Application No. 201680083301.2.

* cited by examiner

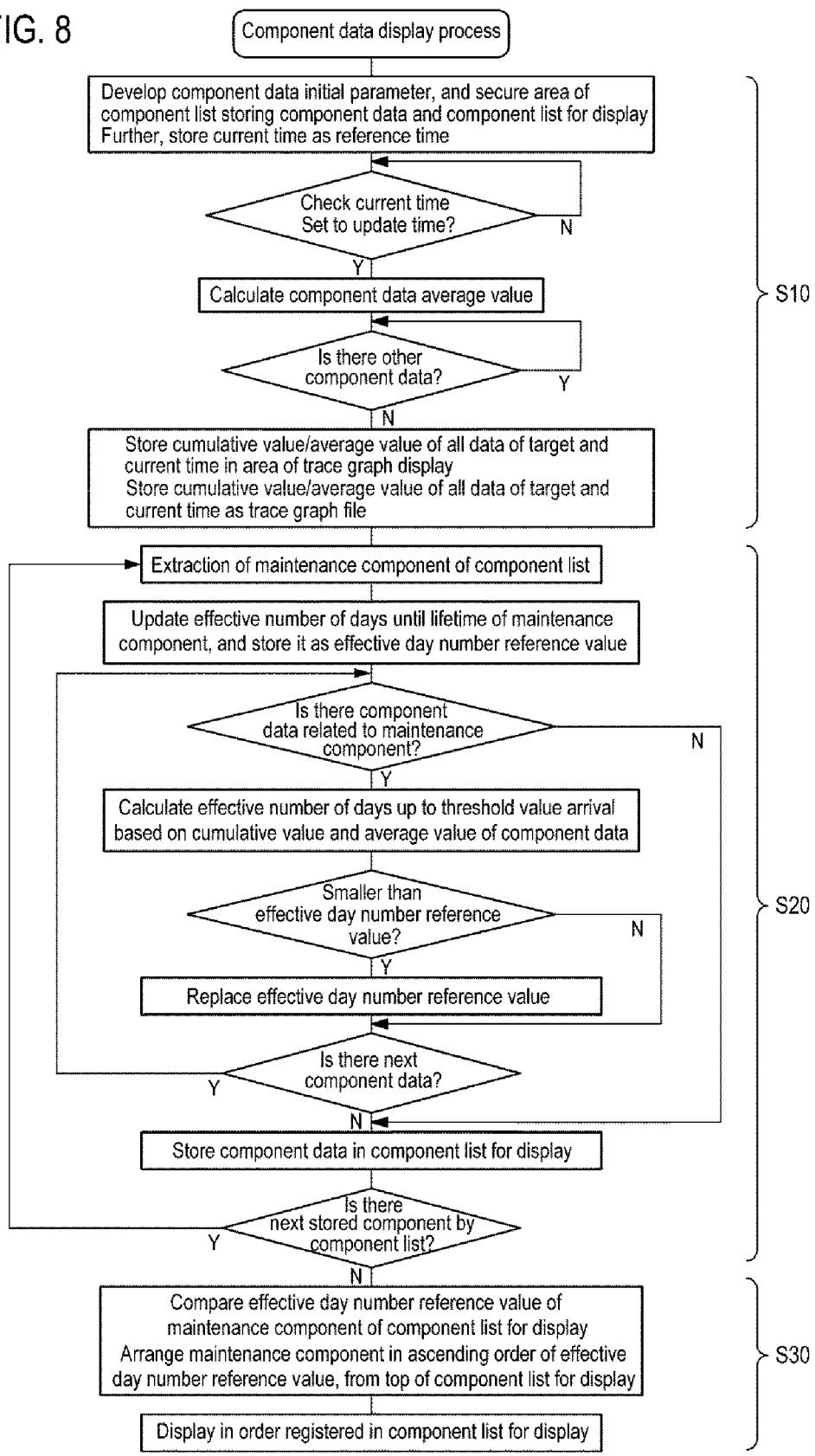

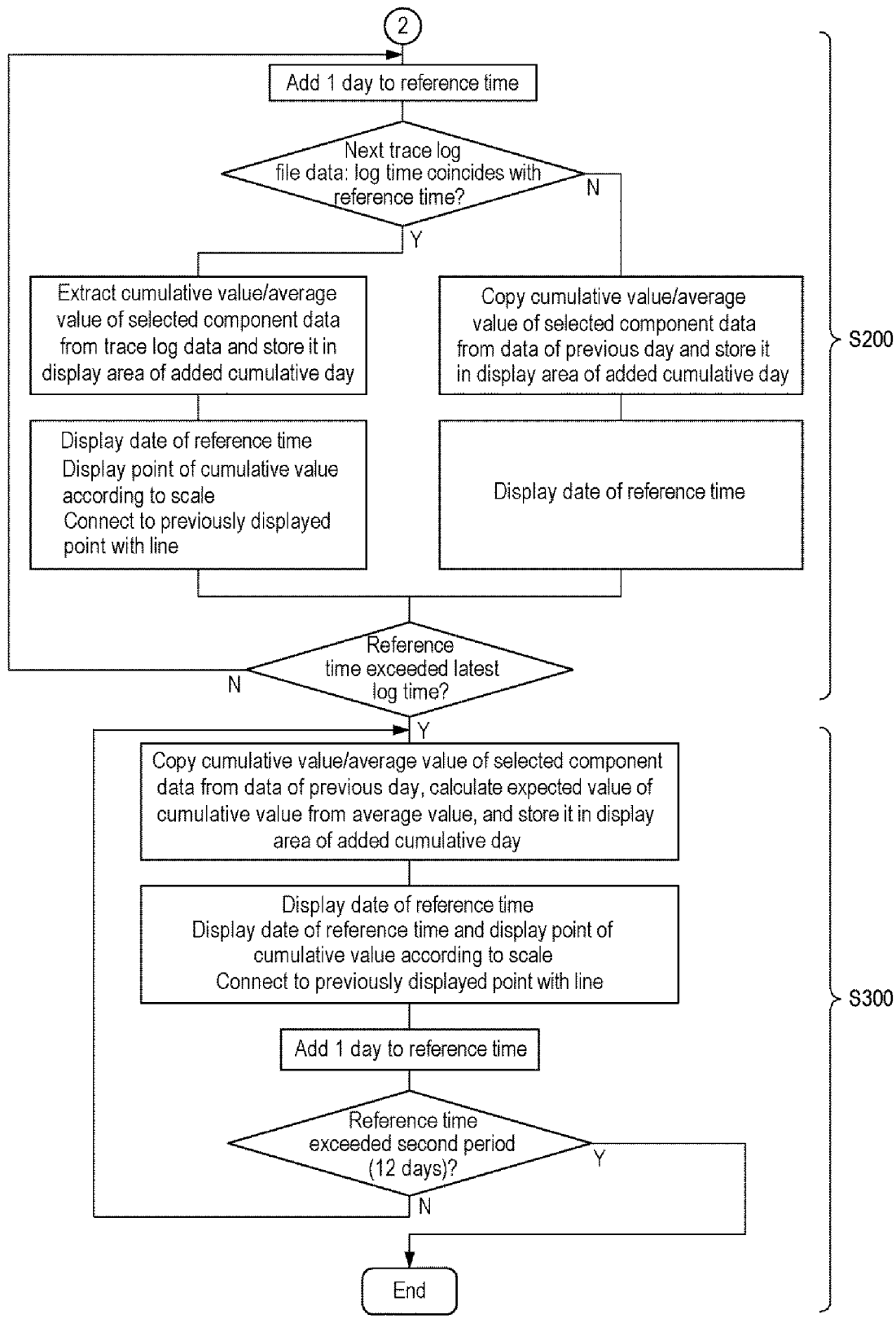

FIG. 10

| SYS | | Non-display item | ◁ ▷ | Page number 1/2 | |
|---|---|---|---|---|---|
| | | | | Time limit reached | Component maintenance |
| 1 | Transfer robot | | | | |
| 2 | Air cylinder(Furnace port cylinder support R) | | | 2016/03/26 | Component maintenance |
| 3 | Air cylinder(Furnace port cylinder UP/DOWN) | | | 2016/05/26 | Component maintenance |
| 4 | Air cylinder(Furnace port cylinder OPEN/CLOSE) | | | 2016/12/13 | Component maintenance |
| 5 | Air cylinder (front shutter) | | | Good | Component maintenance |

FIG. 12

| Use start | Time limit | Effective number of days | File time (number of days) |
|---|---|---|---|
| 2016/02/17-17:02:41 | 2016/12/13 | 291 | 300 |

1:
| Data name | Current value (pulse) | Average value of day (pulse) | |
|---|---|---|---|
| X-axis total trace pulses | 50 | 5.5 | Data trace |
| Time limit | Effective number of days | Threshold value (pulse) | |
| 2016/09/04 | 191 | 1000 | Replacement history |

2:
| Data name | Current value (pulse) | Average value of day (pulse) | |
|---|---|---|---|
| Y-axis total trace pulses | 500 | 55.5 | Data trace |
| Time limit | Effective number of days | Threshold value (pulse) | |
| 2016/04/12 | 46 | 3000 | Replacement history |

3:
| Data name | Current value (pulse) | Average value of day (pulse) | |
|---|---|---|---|
| Z-axis total trace pulses | 5000 | 555.5 | Data trace |
| Time limit | Effective number of days | Threshold value (pulse) | |
| 2016/03/07 | 10 | 10000 | Replacement history |

4:
| Data name | Current value (pulse) | Average value of day (pulse) | |
|---|---|---|---|
| R-axis total trace pulses | 50000 | 5555.5 | Data trace |
| Time limit | Effective number of days | Threshold value (pulse) | |
| Time limit reached "2016/02/25-17:05:08" | 0 | 50000 | Replacement history |

| Use start | 2016/02/26-18:17:18 | Number of replacements | 14 |
|---|---|---|---|
| Data name | R-axis total trace file | Data average value | 1094023 |

| No. | Replacement day and time | Threshold value arrival day and time | Data value |
|---|---|---|---|
| 1 | 2016/02/29-17:05:08 | ------ | 3533 |
| 2 | 2016/03/10-17:05:08 | ------ | 6588 |
| 3 | 2016/03/16-17:05:08 | ------ | 9528 |
| 4 | 2016/04/09-17:05:08 | ------ | 8000 |
| 5 | 2017/04/09-17:05:08 | ------ | 300 |
| 6 | 2018/04/09-17:05:08 | ------ | 765320 |
| 7 | 2019/05/14-17:05:08 | ------ | 657555 |
| 8 | 2020/09/25-17:05:08 | ------ | 803245 |
| 9 | 2021/07/22-17:05:08 | ------ | 908832 |
| 10 | 2016/02/26-18:17:18 | 2016/02/25-17:05:08 | 7777333 |

FIG. 15

| No. | Replacement day and time | |
|---|---|---|
| | Use start | 2021/07/22-17:05:08 | Number of replacements | 13 |
| 1 | 2016/02/26-17:05:08 | Component data |
| 2 | 2016/02/29-17:05:08 | Component data |
| 3 | 2016/03/10-17:05:08 | Component data |
| 4 | 2016/03/16-17:05:08 | Component data |
| 5 | 2016/04/09-17:05:08 | Component data |
| 6 | 2017/04/09-17:05:08 | Component data |
| 7 | 2018/04/09-17:05:08 | Component data |
| 8 | 2019/05/14-17:05:08 | Component data |
| 9 | 2020/09/25-17:05:08 | Component data |
| 10 | 2021/07/22-17:05:08 | Component data |

Replacement (regular) — 621
Replacement (failure) — 622
Cancel
ESC
SCREEN COPY

FIG. 16

| Replacement day and time | 2016/02/26-17:05:08 |

1:
| Data name | Data value (pulse) |
|---|---|
| X-axis total trace file | 0 |

2:
| Data name | Data value (pulse) |
|---|---|
| Y-axis total trace file | 0 |

3:
| Data name | Data value (pulse) |
|---|---|
| Z-axis total trace file | 0 |

4:
| Data name | Data value (pulse) |
|---|---|
| R-axis total trace file | 0 |

FIG. 17

| Number of item | Component name | Relation | Display |
|---|---|---|---|
| 1 | Transfer robot | — | ○ |
| 2 | Air cylinder (furnace port shutter support R) | — | ○ |
| 3 | Air cylinder (furnace shutter support UP/DOWN) | — | ○ |
| 4 | Air cylinder (furnace shutter support OPEN/CLOSE) | — | ○ |
| 5 | Air cylinder (front shutter) | — | ○ |
| 6 | X-axis total drive pulse | 1 | × |
| 7 | Y-axis total drive pulse | 1 | × |
| 8 | Z-axis total drive pulse | 1 | × |
| 9 | R-axis total drive pulse | 1 | × |
| 10 | | | |

SUBSTRATE PROCESSING APPARATUS AND CONTROLLER

CROSS-REFERENCE TO RELATED APPLICATION

This application is a Bypass Continuation Application of PCT International Application No. PCT/JP2016/057973, filed Mar. 14, 2016, the disclosure of which is incorporated herein in its entirety by reference.

TECHNICAL FIELD

The present disclosure relates to maintenance component management of a semiconductor manufacturing apparatus which is a kind of a substrate processing apparatus for processing a substrate.

BACKGROUND

Each of the maintenance components of a semiconductor manufacturing apparatus has its predetermined component lifetime, maintenance cycle, and the like. In general, device makers (customers who use a semiconductor manufacturing apparatus) perform cleaning of components, which are managed by a cumulative film thickness, such as quartz components, and perform component replacement as necessary. For example, in the related art, the maintenance is conventionally carried out according to hours of use, the number of uses, and a cumulative film thickness.

In such a conventional maintenance component management function, a user sets in advance a threshold value to notify a warning of data specifying exhaustion of the number of uses and the like, and notifies it at the stage when the threshold value is exceeded. Therefore, for example, a warning may be issued at the stage where it can be still used, which results in replacement, or it may be replaced after a failure without any warning, depending on the threshold value. Therefore, since it is necessary for the user who sets the threshold value to set a value in advance in consideration of a component replacement period, a component lead time, and the number of uses, it takes time to set up. In addition, an erroneous operation may also occur by misconfiguration.

The maintenance is also performed for overhaul (O/H) and adjustment (calibration) for preventive maintenance with reference to an elapsed time. However, components (maintenance components), except for some parts such as quartz parts as described above, are replaced when failure occurs (when there is any trouble). This is because it is impossible to accurately recognize the use status of components. For example, when the timing of the failure of the component is during the operation (product production) of the device, it causes lot out. Accordingly, the damage amount increases due to the lot out according to an increase in diameter of a silicon wafer, the high integration of a semiconductor device and the 3D structure, requiring countermeasures for a more stable operation of the apparatus.

SUMMARY

Some embodiments of the present disclosure provide a configuration capable of recognizing use status of components constituting a substrate processing apparatus.

According to one embodiment of the present disclosure, there is provided a configuration including: a screen control part configured to display on a display part a maintenance component management screen displaying a component, a mechanism, or both, which is selected as a management target from components constituting the apparatus, mechanisms configured with a plurality of components, or both, as a maintenance component; a collection part configured to collect component data related to the maintenance component; a determination part configured to compare a cumulative value of the component data with a predetermined threshold value to determine the cumulative value exceeding the threshold value; a calculation part configured to calculate a replacement time; and an operation part configured to calculate replacement times based on an average value of the component data and a cumulative value of the component data for each predetermined cycle with respect to the component data of the mechanism and the components constituting the mechanism, display the maintenance component sequentially from the maintenance component reaching the earliest replacement time on the maintenance component management screen, and display the maintenance component on the display part in a state where the component data related to the maintenance component is updated for the predetermined cycle.

BRIEF DESCRIPTION OF DRAWINGS

FIG. 8 is a diagram illustrating a process flow of the component management function suitably used in the substrate processing apparatus according to of the present disclosure.

FIG. 9B is a diagram illustrating a process flow of the component management function suitably used in the substrate processing apparatus according to the present disclosure.

FIG. 10 is an exemplary example of a maintenance component management screen suitably used in one embodiment of the present disclosure.

FIG. 12 is an exemplary example illustrating the component management function suitably used in one embodiment of the present disclosure.

FIG. 14 is an exemplary example illustrating the component management function suitably used in one embodiment of the present disclosure.

FIG. 15 is an exemplary example illustrating the component management function suitably used in one embodiment of the present disclosure.

FIG. 16 is an exemplary example illustrating the component management function suitably used in one embodiment of the present disclosure.

FIG. 17 is an exemplary example illustrating a maintenance component list according to one embodiment of the present disclosure.

DETAILED DESCRIPTION

<One Embodiment of the Present Disclosure>

Figure 1:
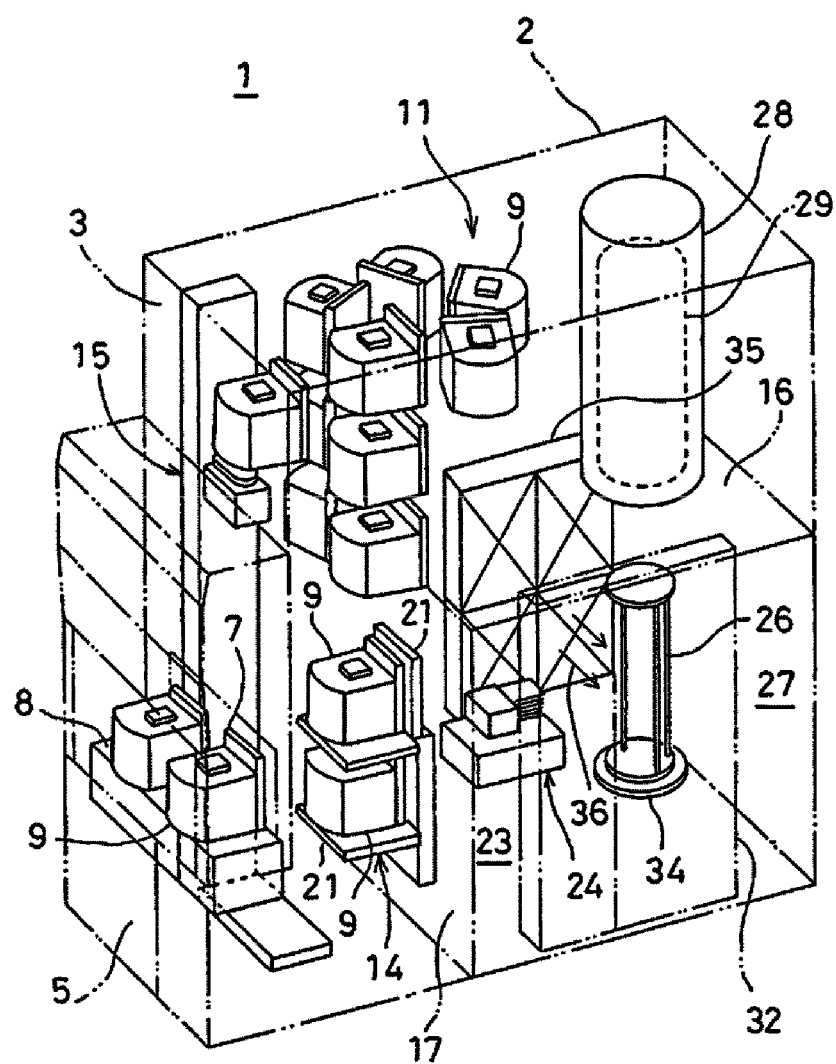
FIG. 1 is a perspective view illustrating a substrate processing apparatus suitably used in one embodiment of the present disclosure.
Figure 2:
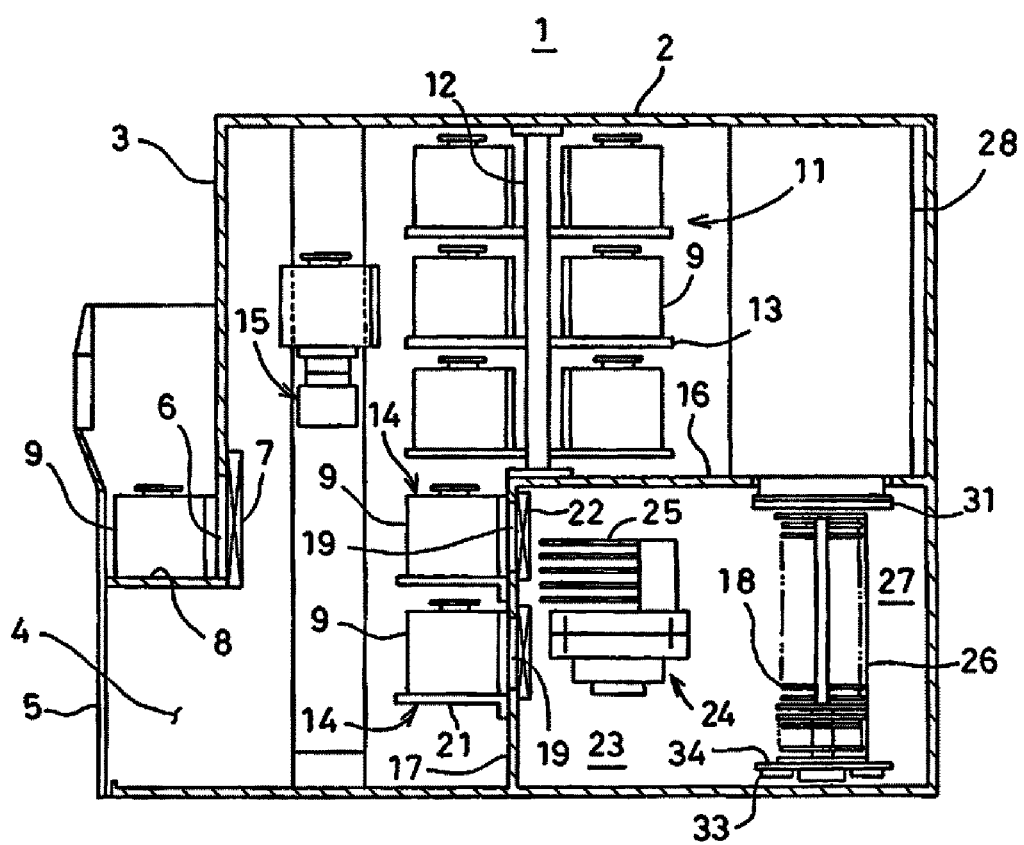
FIG. 2 is a side sectional view illustrating the substrate processing apparatus suitably used in one embodiment of the present disclosure.

One embodiment of the present disclosure will now be described with reference to the drawings. First, in FIG. 1 and FIG. 2, a substrate processing apparatus 1 in which the present disclosure is implemented will be described.

The substrate processing apparatus 1 includes a housing 2, and a front maintenance port 4, as an opening provided so as to perform maintenance, is installed in a lower portion of a front wall 3 of the housing 2 and is opened and closed by a front maintenance door 5.

A pod loading/unloading port 6 is formed on the front wall 3 of the housing 2 so as to communicate between the inside and the outside of the housing 2 and is opened and closed by a front shutter (loading/unloading opening/closing mechanism) 7. A load port (substrate transfer container delivery table) 8 is installed on a front side of the pod loading/unloading port 6, and the load port 8 is configured to align the loaded pod 9.

The pod 9 is a sealed substrate transfer container, and is loaded into the load port 8 or unloaded from the load port 8 by means of an in-process transfer device (not shown).

A rotary pod shelf (substrate transfer container storage shelf) 11 is installed above a substantially central portion in a front-back direction in the housing 2 and is configured to store a plurality of pods 9.

The rotary pod shelf 11 includes a post 12 installed to be vertically erected and intermittently rotated, and a plurality of stages of shelf plates (substrate transfer container loading plates) 13 radially supported at respective positions of upper, middle and lower stages of the post 12. The shelf plates 13 are configured to be held with the plurality of pods 9 mounted thereon.

A pod opener (substrate transfer container cover opening/closing mechanism) 14 is installed below the rotary pod shelf 11, and is configured to load the pod 9 and open and close the cover of the pod 9.

A pod transfer mechanism (container transfer mechanism) 15 is installed between the load port 8, the rotary pod shelf 11 and the pod opener 14. The pod transfer mechanism is configured to support the pod 9 and move up/down and forward/backward in a horizontal direction so that the pod 9 is transferred between the load port 8, the rotary pod shelf 11, and the pod opener 14.

A sub housing 16 is installed at a lower portion inside the housing 2 to extend from the substantially central portion to the rear end in the front-back direction in the housing 2. A pair of wafer loading/unloading ports (substrate loading/unloading ports) 19 for loading and unloading wafers (substrates) 18 into and from the sub housing 16 is vertically arranged in two stages and installed on the front wall 17 of the sub housing 16, and the pod opener 14 is installed in each of the upper and lower wafer loading/unloading ports 19.

The pod opener 14 includes a mounting table 21 on which the pod 9 is mounted and an opening/closing mechanism 22 for opening and closing the cover of the pod 9. The pod opener 14 is configured to open and close the cover of the pod 9 mounted on the mounting table 21 by the opening/closing mechanism 22, to thereby open and close the wafer entrance of the pod 9.

The sub housing 16 forms a transfer chamber 23 that is sealed from a space (pod transfer space) in which the pod transfer mechanism 15 and the rotary pod shelf 11 are arranged. A wafer transfer mechanism (substrate transfer mechanism) 24 as a transfer robot is installed in the front area of the transfer chamber 23. The wafer transfer mechanism 24 is provided with a required number of wafer mounting plates 25 (in this example, five of them) on which the wafers 18 are mounted. The wafer mounting plates 25 are configured to be horizontally translatable, horizontally rotatable, or movable up and down. The wafer transfer mechanism 24 is configured to load and unload the wafers 18 to and from a boat (substrate support) 26.

A standby part 27 which accommodates the boat 26 and stands by is formed in the rear area of the transfer chamber 23. A vertical type process furnace 28 is installed above the standby part 27. The process furnace 28 has a process chamber 29 formed therein, and the lower end portion of the process chamber 29 becomes a furnace port part. The furnace port part is opened and closed by a furnace opening shutter (furnace port opening/closing mechanism) 31.

A boat elevator (substrate holding elevator mechanism) 32, which is configured to move the boat 26 up and down, is installed between the right end portion of the housing 2 and the right end portion of the standby part 27 of the sub housing 16. A seal cap 34 as a cover body is horizontally attached to an arm 33 connected to the elevator base of the boat elevator 32. The seal cap 34 is configured to vertically support the boat 26 and to be able to hermetically seal the furnace port part in a state where the boat 26 is loaded into the process chamber 29.

The boat 26 is configured to hold a plurality of wafers 18 (for example, about 50 to 125 wafers) in a horizontal posture and in multiple stages with the centers of the wafers 18 aligned with one another.

A clean unit 35 is disposed at a position opposite the boat elevator 32 side, and is configured with a supply fan and a dustproof filter that supplies a cleaned atmosphere or a clean air 36 which is an inert gas. A notch aligner (not shown) as a substrate aligning device for aligning a position of the circumferential direction of the wafers 18 is installed between the wafer transfer mechanism 24 and the clean unit 35.

It is configured such that the clean air 36 blown out from the clean unit 35 is distributed around the notch aligner (not shown), the wafer transfer mechanism 24 and the boat 26, and then sucked in by a duct (not shown) to be discharged to the outside of the housing 2 or blown into the transfer chamber 23 by the clean unit 35.

Next, an operation of the substrate processing apparatus 1 will be described.

When the pod 9 is supplied to the load port 8, the pod loading/unloading port 6 is opened by the front shutter 7. The pod 9 on the load port 8 is loaded into the housing 2 by the pod transfer mechanism 15 via the pod loading/unloading port 6, and is mounted on the shelf plates 13 designated in the rotary pod shelf 11. The pod 9 is temporarily stored in the rotary pod shelf 11 and then transferred from the shelf plates 13 to one of the pod openers 14 by the pod transfer mechanism 15 and transferred to the mounting table 21 or directly transferred from the load port 8 to the mounting table 21.

At this time, the wafer loading/unloading port 19 is closed by the opening/closing mechanism 22, and the clean air 36 is distributed and filled in the transfer chamber 23. For example, the transfer chamber 23 is filled with a nitrogen gas as the clean air 36, so that the concentration of oxygen in the transfer chamber 23 is set to 20 ppm or less, which is much lower than the oxygen concentration of the interior of the housing 2 (air atmosphere).

The opening-side end surface of the pod 9 mounted on the mounting table 21 is pressed against the opening edge side of the wafer loading/unloading port 19 in the front wall 17 of the sub housing 16, and its cover is removed by the opening/closing mechanism 22 to open the wafer entrance.

When the pod 9 is opened by the pod opener 14, the wafers 18 are picked up from the pod 9 by the wafer transfer mechanism 24 and transferred to the notch aligner (not shown) to align the wafers 18, and the wafer transfer mechanism 24 loads the wafers 18 into the standby part 27 behind the transfer chamber 23 and charges the wafers 18 in the boat 26.

The wafer transfer mechanism 24, which transfers the wafers 18 to the boat 26, returns to the pod 9 and charges a next wafer 18 into the boat 26.

During the charging operation of the wafers 18 from one side (the upper stage or the lower stage) pod opener 14 into the boat 26 by the wafer transfer mechanism 24, another pod 9 is transferred and mounted from the rotary pod shelf 11 to the other side (the lower stage or the upper stage) pod opener 14 by the pod transfer mechanism 15 and the operation of opening the pod 9 is performed by the other pod opener 14 at the same time.

When a predetermined number of wafers 18 are charged into the boat 26, the furnace port part of the process furnace 28 which has been closed by the furnace port shutter 31 is opened by the furnace port shutter 31. Subsequently, the boat 26 is lifted up by the boat elevator 32 and is loaded into the process chamber 29 (loading).

After the loading, the furnace port part is hermetically sealed by the seal cap 34. In the present embodiment, at this timing (after the loading), a purge step (pre-purge step) is also performed to substitute the process chamber 29 with an inert gas.

The process chamber 29 is vacuum-exhausted by a gas exhaust mechanism (not shown) so as to reach a desired pressure (degree of vacuum). In addition, the process chamber 29 is heated to a predetermined temperature by a heater driving part (not shown) so as to have a desired temperature distribution.

Furthermore, a processing gas, which is controlled to have a predetermined flow rate, is supplied by a gas supply mechanism (not shown) to make contact with the surfaces of the wafers 18 while distributing the processing gas in the process chamber 29, so that a predetermined process is performed on the surfaces of the wafers 18. The processing gas after the reaction is exhausted from the process chamber 29 by the gas exhaust mechanism.

When a predetermined processing time has elapsed, an inert gas is supplied from an inert gas supply source (not shown) by the gas supply mechanism, so that the process chamber 29 is substituted by an inert gas and the pressure of the process chamber 29 is returned to an atmospheric pressure (after purge step). Then, the boat 26 is moved down by the boat elevator 32 via the seal cap 34.

When unloading the processed wafers 18, the wafers 18 and the pod 9 are unloaded to the outside of the housing 2 using a procedure that is the reverse of the one described above. The unprocessed wafers 18 are further charged into the boat 26, and the batch processing of the wafers 18 is repeated.

Figure 3:
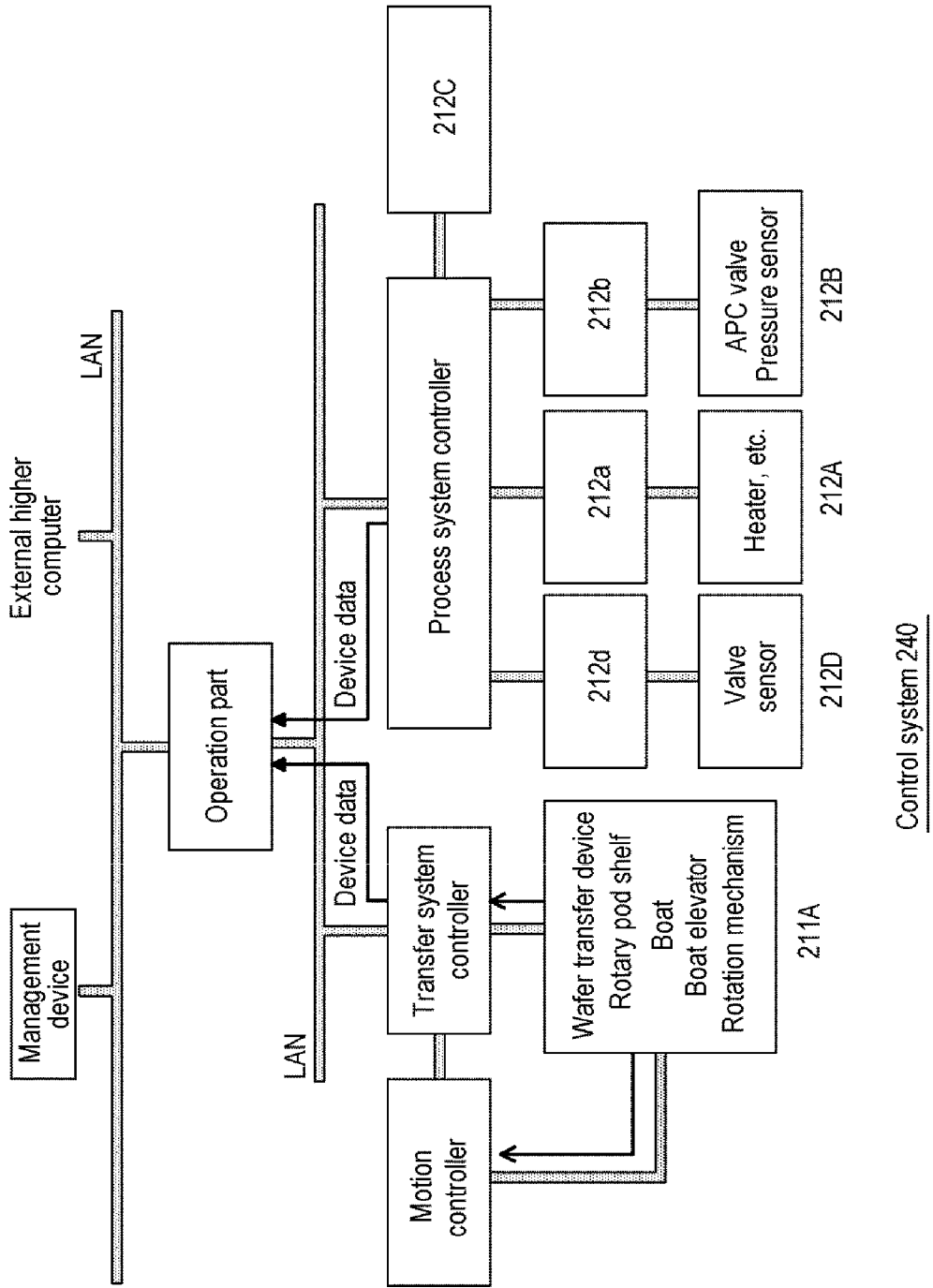
FIG. 3 is a cross sectional view illustrating a configuration of a controller suitably used in one embodiment of the present disclosure.
Figure 4:
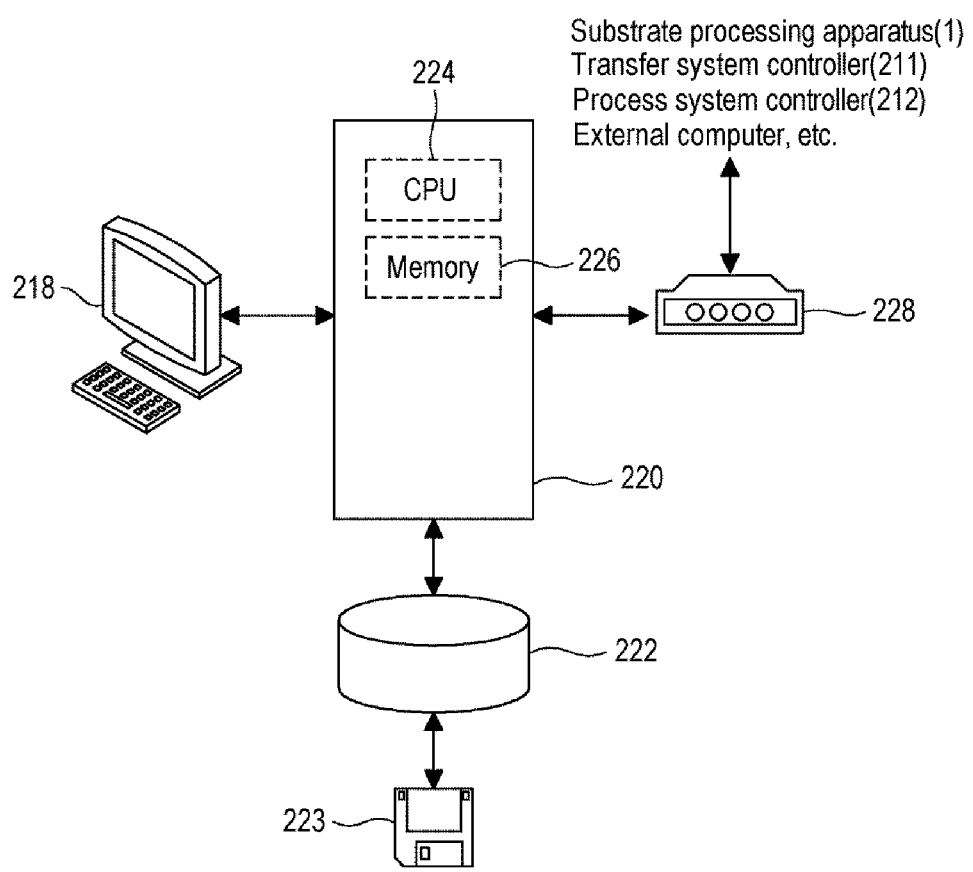
FIG. 4 is a diagram illustrating a configuration of a main controller (operation part) suitably used in one embodiment of the present disclosure.

The process furnace 28, the pod transfer mechanism 15 that is a mechanism for transferring at least a substrate, the wafer transfer mechanism 24, a transfer mechanism including the boat elevator 32 and the like, a gas supply mechanism for supplying a processing gas or the like to the process furnace 28, a gas exhaust mechanism for exhausting the interior of the process furnace 28, a heater driving part for heating the process furnace 28 to a predetermined temperature, and a control system 240 which controls the process furnace 28, the transfer mechanism, the gas supply mechanism, the gas exhaust mechanism, and the heater driving part will be described with reference to FIGS. 3 and 4.

Next, a configuration of the control system 240 by focusing on an operation part 201 as a main controller will be described with reference to FIG. 3. As illustrated in FIG. 3, the control system 240 includes the main controller 201, a transfer system controller 211 as a transfer control part, and a process system controller 212 as a process control part. Since the main controller 201 is electrically connected to the transfer system controller 211 and the process system controller 212 via a local area network (LAN) such as, for example, 100BASE-T or the like, it may be possible to transmit and receive each device data, download and upload each file, and the like. In addition, a management device may be included in the control system 240.

The main controller 201 has a port serving as a mounting part in which a USB memory or the like that is a recording medium as an external storage device is inserted and removed. An OS corresponding to such a port is installed in the main controller 201. Furthermore, the main controller 201 is connected to an external higher computer (not shown) via, for example, a communication network. Therefore, even when the substrate processing apparatus 1 is installed in a clean room, the higher computer may be arranged in an office or the like outside the clean room. In addition, the management device is connected to the substrate processing apparatus 1 via an LAN line, and has a function of collecting device data from the operation part 201. Similarly, the management device may also be disposed in an office or the like outside the clean room.

The operation part 201 has at least a function of collecting device data (hereinafter, also referred to as component data) related to predetermined maintenance components among the device data from the substrate processing apparatus 1 by executing a component management program. Specifically, the component data is data for monitoring maintenance information of respective components constituting the substrate processing apparatus 1. Here, the types of the maintenance components to be monitored are components constituting the substrate processing apparatus 1 and respective mechanisms configured with a plurality of components. Units configured with a plurality of mechanisms may also be included. Furthermore, the device data includes not only control parameters such as data, for example, temperature data, pressure data, gas flow rate data and the like transmitted from respective components constituting the substrate processing apparatus 1 to the operation part 201 but also data indicating the opening/closing operation of valves, and also includes data generated by each controller, for example, input data such as setting values to be input to a display part 218 of the operation part 201.

The transfer system controller 211 is mainly connected to a substrate transfer system 211A including the rotary pod shelf 11, the boat elevator 32, the pod transfer mechanism (substrate container transfer mechanism) 15, the wafer transfer mechanism (substrate transfer mechanism) 24, the boat 26, and the rotation mechanism (not shown). The transfer system controller 211 is configured to control the transfer operation of each of the mechanisms including the rotary pod shelf 11, the boat elevator 32, the pod transfer mechanism (substrate container transfer mechanism) 15, the wafer transfer mechanism (substrate transfer mechanism) 24, and the rotation mechanism (not shown).

The process system controller 212 includes a temperature controller 212a, a pressure controller 212b, a gas flow rate controller 212c, and a sequencer 212d. The temperature controller 212a, pressure controller 212b, gas flow rate controller 212c, and sequencer 212d constitute a sub controller, and are electrically connected to the process system controller 212 so that the transmission and reception of each device data, the downloading and uploading of each file and the like are possible. Although the process system controller 212 and the sub controller are illustrated separately, they may also be integrated.

A heating mechanism 212A, which is mainly configured with a heater, a temperature sensor, and the like, is connected to the temperature controller 212a. The temperature controller 212a is configured to control the internal temperature of the process furnace 28 by controlling the temperature of the heater of the process furnace 28, and is also configured to control the switching (ON/OFF) of a thyristor and to control electric power supplied to a heater wire.

A gas exhaust mechanism 212B, which is mainly configured with a pressure sensor, an APC valve as a pressure valve, and a vacuum pump, is connected to the pressure controller 212b. Based on a pressure value detected by the pressure sensor, the pressure controller 212b is configured to control the opening degree of the APC valve and the switching (ON/OFF) of the vacuum pump such that the internal pressure of the process chamber 29 becomes a desired pressure at a desired timing.

The gas flow rate controller 212c is configured with a mass flow controller (MFC). The sequencer 212d is configured to control the supply and stop of a gas from a processing gas supply pipe and a purge gas supply pipe by opening and closing a valve 212D. Furthermore, the process system controller 212 is configured to control the gas flow rate controller 212c (MFC) and the sequencer 212d (valve 212D) such that the flow rate of a gas supplied into the process chamber 29 becomes a desired flow rate at a desired timing.

In addition, the main controller 201, the transfer system controller 211, and the process system controller 212 according to an embodiment of the present disclosure can be realized by using a general computer system, not by a dedicated system. For example, each controller that executes a predetermined process may be configured by installing a program from a recording medium (a flexible disk, a CD-ROM, a USB, or the like) storing the program for causing a general-purpose computer to execute the aforementioned process.

Means for supplying such a program is optional. The program may be supplied via the predetermined recording medium as described above, and for example, via a communication line, a communication network, a communication system, or the like. In this case, for example, the program may be posted on the bulletin board of the communication network, and may be superimposed on a carrier wave to be provided via the network. By booting the program thus provided and executing it in the same manner as other application programs under the control of an OS, the predetermined process can be executed.

Next, a configuration of the operation part 201 will be described with reference to FIG. 4.

The operation part 201 is configured as a computer including a central processing unit (CPU) 224 as a processing part, a memory (a RAM, a ROM, or the like) 226 as a temporary storage part, a hard disk (HDD) 222 as a storage part, a transmission/reception module 228 as a communication part, a display device 218 as a display part, and a clock function (not shown). Each recipe file such as a recipe or the like defining processing conditions and processing procedures, a control program file for executing each recipe file, a parameter file for setting processing conditions and processing procedures, various screen files including an input screen for inputting process parameters, and various icon files or the like (none of them are not shown), in addition to an error processing program file and an error processing parameter file, are stored in the hard disk 222. In the present embodiment, a component management program (FIG. 5 or the like) for managing the maintenance components of the semiconductor manufacturing apparatus is stored in the hard disk 222. In addition, a maintenance component list illustrated in FIG. 17 as described hereinbelow and screen files of respective screens illustrated in FIGS. 10 to 16 as described hereinbelow are stored in the hard disk 222.

The display device 218 is configured to display an operation screen for operating the substrate processing apparatus 1. The operation screen of the display device 218 has a screen for checking the status of the substrate transfer system and the substrate processing system. For example, operation buttons as an input part for inputting an operation instruction to the substrate transfer system 211A and the substrate processing system (the heating mechanism 212A, the gas exhaust mechanism 212B, and the gas supply system 212C), which is illustrated in FIG. 3, may be arranged on the operation screen of the display device 218. The display device 218 displays information generated in the substrate processing apparatus 1 on the operation screen.

Furthermore, the display device 218 outputs the information displayed on the operation screen to a device such as a USB memory inserted in the operation part 201. The display device 218 receives operator's input data (input instruction) from the operation screen and transmits the input data to the operation part 201. In addition, the display device 218 is configured to receive an instruction (control instruction) to execute an arbitrary substrate processing recipe (also referred to as a "process recipe") among recipes developed in a memory (RAM) or the like as described hereinbelow or a plurality of recipes stored in a storage part as described hereinbelow, and to transmit it to the operation part 201.

In the present embodiment, it is configured such that a database function of collecting the device data, a function of extracting and accumulating the component data related to the maintenance components out of the device data, a function of processing each data using the accumulated component data or device data to create trace data and graphing it in time series, a function of developing each stored screen table and reading the device data to display each screen illustrated in FIGS. 10 to 16 as described hereinbelow on the display part 218, and the like are realized by executing the component management program by the operation part 201. A configuration of the component management program will be described later with reference to FIGS. 5 and 6.

In addition, a switching hub or the like is connected to the transmission/reception module 228 of the operation part 201, and the operation part 201 is configured to transmit and receive data to and from an external computer or the like via a network. The operation part 201 may be configured to include a main control section 220 including at least the CPU 224, the memory 226 and the like, the communication part 228 that transmits and receives data to and from an external computer or the like via a network, a user interface (UI) part including a display part 218 such as a liquid crystal display and a pointing device such as a keyboard and a mouse, in addition to the storage part 222 such as a hard disk drive, and the like. The main control section 220 may also be configured to further include the communication part 228.

Furthermore, the main controller 201 transmits device data such as the status of the substrate processing apparatus 1 to an external higher computer, for example, a host computer, via a network (not shown). The substrate processing apparatus 1 is, for example, a vertical type apparatus which performs oxidation, diffusion processing, CVD processing or the like on a substrate. The substrate processing apparatus 1 is also controlled by the control system 240 based on each recipe file, each parameter file, or the like stored in the storage part 222.

(Substrate Processing Method)

Next, a substrate processing method including a predetermined processing step to be performed using the substrate processing apparatus 1 according to the present embodiment will be described. Here, the predetermined processing step is an example of the case of performing substrate processing step, which is one of the processes for manufacturing a semiconductor device.

In performing the substrate processing step, a substrate processing recipe (process recipe) corresponding to the substrate processing to be performed is developed in, for example, the memory such as the RAM in the process system controller 212. Then, an operation instruction is assigned to the process system controller 212 and the transfer system controller 211 from the main controller 201, as necessary. The substrate processing step performed in this manner has at least a loading step, a film forming step, and a boat transfer step. In addition, a transfer step (which may include a substrate loading step as described hereinbelow) may be included in the substrate processing step.

(Transfer Step)

An instruction to drive the wafer transfer mechanism 24 is issued from the main controller 201 to the transfer system controller 211. Then, the wafer transfer mechanism 24 starts the transfer processing of the wafers 18 from the pod 9 on the delivery stage 21 as the mounting table to the boat 26 according to an instruction from the transfer system controller 211. This transfer processing is performed until the charging of all scheduled wafers 18 into the boat 26 (wafer charging) is completed.

(Loading Step)

If a specified number of wafers 18 is charged into the boat 26, the boat 26 is lifted up by the boat elevator 32 that operates according to an instruction from the transfer system controller 211 and is loaded into the process chamber 29 formed in the process furnace (boat loading). When the boat 26 is completely loaded, the seal cap 34 of the boat elevator 32 hermetically seals the lower end of a manifold of the process furnace 28.

(Film-Forming Step)

Thereafter, the interior of the process chamber 29 is vacuum-exhausted by a vacuum exhaust device so as to reach a predetermined film-forming pressure (degree of vacuum) according to an instruction from the pressure controller 212b. In this operation, the internal pressure of the process chamber 29 is measured by the pressure sensor. A pressure regulation device is feedback-controlled based on the measured pressure information. The interior of the process chamber 29 are heated by the heater to a desired temperature according to an instruction from the temperature controller 212a. In this operation, a state of supplying electric power to the heater is feedback-controlled based on the temperature information detected by the temperature sensor as a temperature detector such that the interior of the process chamber 29 becomes a desired temperature (film-forming temperature). Subsequently, the rotation of the boat 26 and the wafers 18 by the rotation mechanism begins according to an instruction from the transfer system controller 211. Then, a predetermined gas (processing gas) is supplied to the plurality of wafers 18 supported by the boat 26, with a predetermined pressure and a predetermined temperature kept, to perform a predetermined process (for example, a film-forming process) on the wafers 18.

(Unloading Step)

When the film-forming step on the wafers 18 mounted on the boat 26 is completed, the rotation of the boat 26 and the wafers 18 by the rotation mechanism is then stopped according to an instruction from the transfer system controller 211, and the seal cap 34 is moved down by the boat elevator 32 to open the lower end of the manifold. Then, the boat 26 supporting the processed wafers 18 is unloaded to the outside of the process furnace 28 (boat unloading).

(Collection Step)

Thereafter, the boat 26 supporting the processed wafers 18 is very effectively cooled by the clean air 36 blown out from the clean unit 35. Then, for example, when it is cooled to 150 degrees C. or lower, the processed wafers 18 are discharged from the boat 26 (wafer discharging) and transferred to the pod 9, and then, the transfer of new unprocessed wafers 18 to the boat 26 is performed.

By repeating the aforementioned steps by executing the process recipe, the substrate processing apparatus 1 according to the present embodiment can perform, for example, the formation of a silicon film on the wafers 18 with high throughput.

(Maintenance Component List)

First, a list of maintenance components of the present embodiment will be described with reference to FIG. 17. The maintenance components of the present embodiment are sorted out in a list as illustrated in FIG. 17. The components listed in this list are objects for managing device data related to the maintenance components. This list is configured to include at least four items of item number, name, relation and display. FIG. 17 merely shows an example, and it may be configured to arbitrarily add or remove an item.

The item number column indicates the order to be read out by the component management program to be described later, and in principle, it is displayed in a list on a maintenance component management function main screen, which will be described later, in the order of this item number.

Also, the component name column indicates the names of maintenance components as maintenance management targets.

In the relation column, when there is a relation between the maintenance components, it is configured to add an item number. When the maintenance components are a mechanism, since there may be a case where the components constituting the mechanism are also maintenance component targets, this item is provided to clarify the relevant maintenance components. For example, in the case of the transfer robot of item No. 1 illustrated in FIG. 17, four axis information (X-axis total drive pulses, Y-axis total drive pulses, Z-axis total drive pulses, and R-axis total drive pulses) from item No. 6 to item No. 9 are related.

Furthermore, the display column is the item as to whether or not to be displayed on the maintenance component management function main screen. Since there may be many components to be managed as the maintenance components and the components to be managed by the customer may be different, it is configured to select the maintenance components to be displayed on the maintenance component management function main screen, thereby improving the operability.

In addition, although only nine maintenance components are described in FIG. 17, this is merely an example illustrating the present embodiment. The number of components to be managed in the list as the maintenance targets is not limited to nine. Hereinafter, it may be simply referred to as a component list. Also, a maintenance component list for display to be displayed on the maintenance component management function main screen may be provided. Even in this case, the format (data structure) is similar to as that of the maintenance component list illustrated in FIG. 17.

(Component Management Program)

The component management program for providing the component management function of the present embodiment to the operation part 201 of the substrate processing apparatus 1 will be described with reference to FIGS. 5 and 6.

Figure 5:
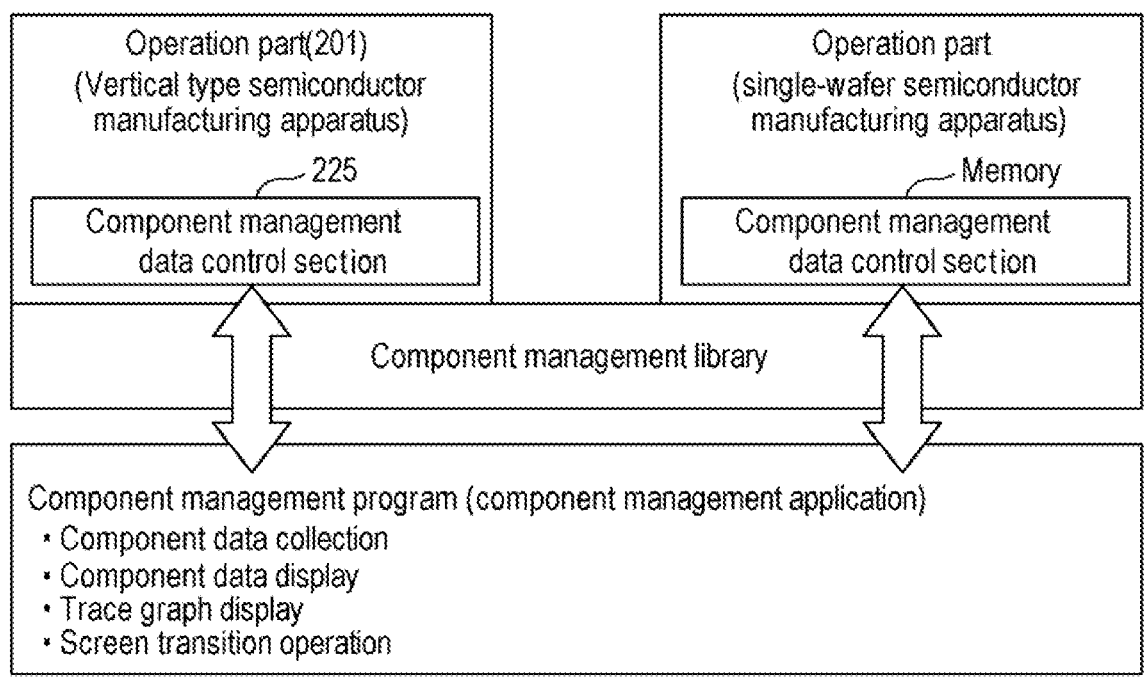
FIG. 5 is a diagram illustrating a configuration of a component management program suitably used in the substrate processing apparatus according to the present disclosure.
Figure 6:
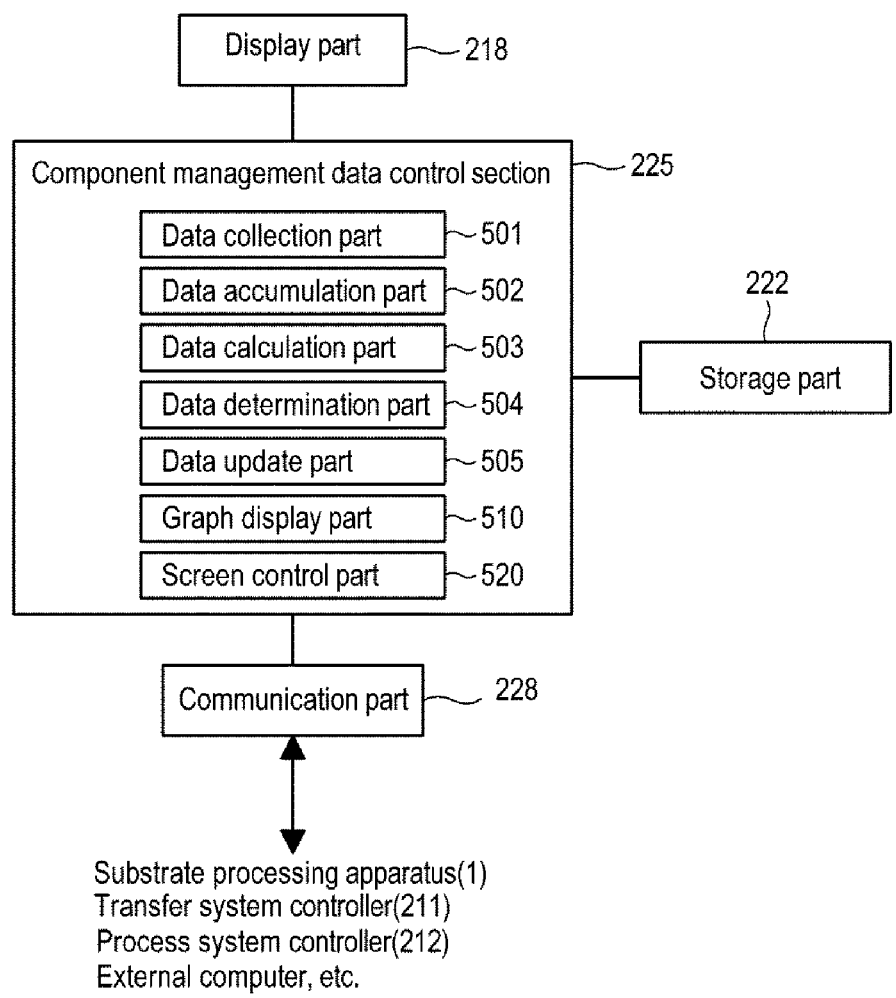
FIG. 6 is an exemplary diagram illustrating the component management program according to one embodiment of the present disclosure.

As illustrated in FIG. 5, when the component management program creates a program (component management data control section 225) for collecting component data using a component management library in the memory 226 of the operation part 201, it is configured such that the component management function of the present embodiment can be realized not only for the operation part of vertical type and single-wafer processing apparatuses but also for the operation part of any other processing apparatus. Accordingly, the component management function of the present embodiment may be used regardless of apparatus types, kinds of the target film, and target processes.

The component management function of the present embodiment is configured to have at least a component data collection function, a component data accumulation function, a trace graph display function, and a screen transition operation function. Here, the operation part 201 is configured to realize the component management data control section 225 as illustrated in FIG. 6 by executing the component management program of the present embodiment. Furthermore, the component management data control section 225 is configured to include a data collection part 501, a data accumulation part 502, a data calculation part 503, a data determination part 504, a data update part 505, a graph display part 510, and a screen control part 520. In addition, the component management data control section 225 is connected to each of the display part 218, the communication part 228 and the storage part 222, and is configured to exchange data with each of them.

The data collection part 501 is configured to collect device data (component data) related to the maintenance components among the device data transmitted via the communication part 228. For example, the data collection part 501 is configured to extract the component data from the device data and store it in the data accumulation part 502.

The data calculation part 503 is configured to calculate a cumulative value of the component data extracted from the device data or an average value of the component data for a predetermined cycle (for example, one day). It is also configured to count up the number of component data. Then, it is configured to calculate a time (replacement time) exceeding a threshold value based on the cumulative value of the component data and the average value of the component data. The threshold value may be appropriately set according to a value recommended by a component maker, specification values of components, or the like.

The data determination part 504 is configured to compare the cumulative value of the component data with a predetermined threshold value to determine whether the cumulative value of the component data has reached the threshold value. In addition, when the cumulative value of the component data exceeds the threshold value, an alarm may be generated. Furthermore, when the maintenance components have a plurality of component data, it is configured to compare the respective calculated replacement times of the component data and determine the threshold value arrival by the component data having the earliest replacement time.

The data update part 505 is configured to update the component data in the data accumulation part 502 according to the determination result of the data determination part 504.

The screen control part 520 is configured to receive an operation instruction from the display part 218 and perform a screen transition process. In addition, the screen control part 520 is configured to display the update result by the data update part 505 or the result of determination by the data determination part 504 on the display part 218.

The graph display part 510 is configured to acquire component data from the trace log file and display the same in time series. According to the present embodiment, it is configured to display the trace graph as illustrated in FIG. 13.

(Maintenance Component Management Function of the Semiconductor Manufacturing Apparatus)

Figure 7:
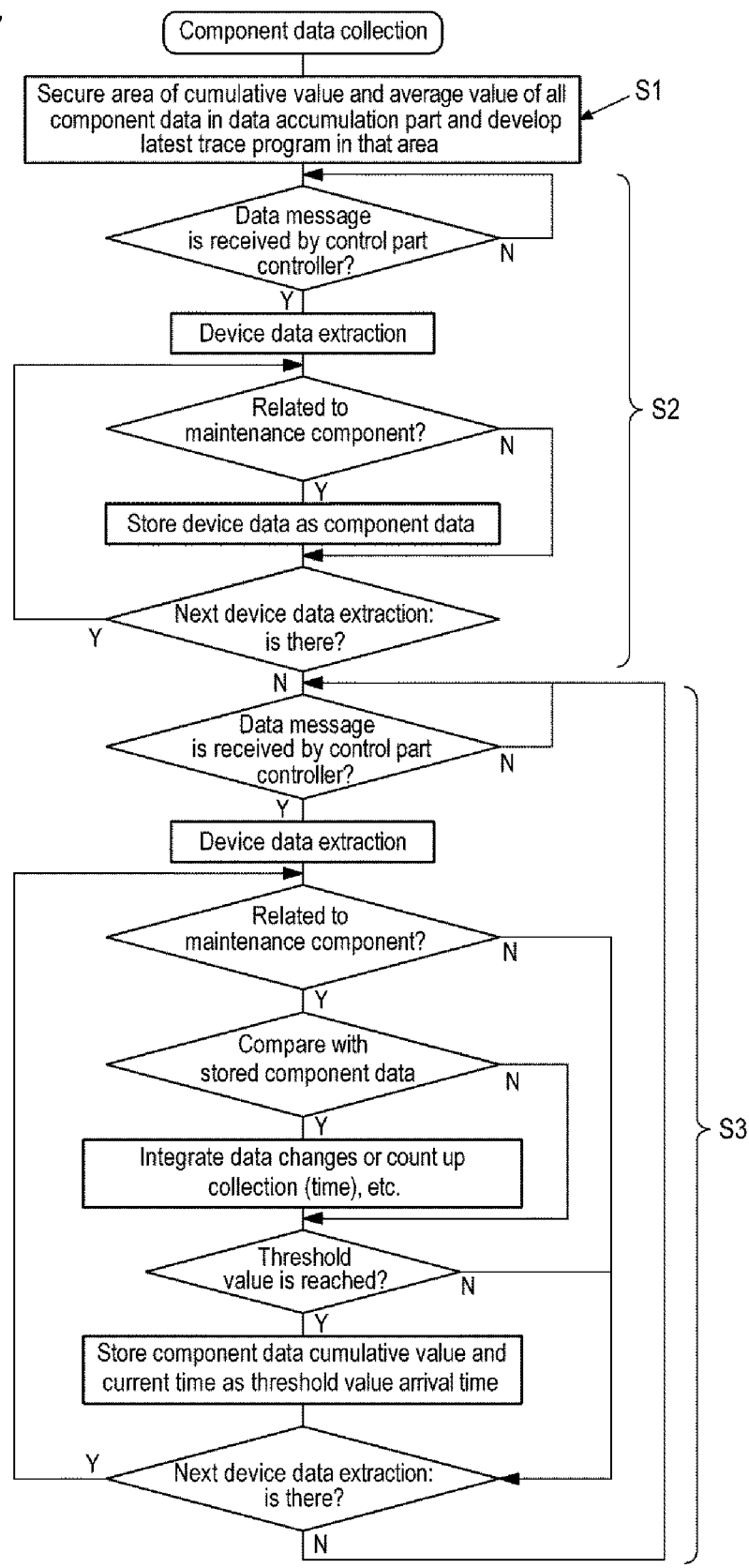
FIG. 7 is a diagram illustrating a process flow of a component management function suitably used in the substrate processing apparatus according to the present disclosure.
Figure 9A:
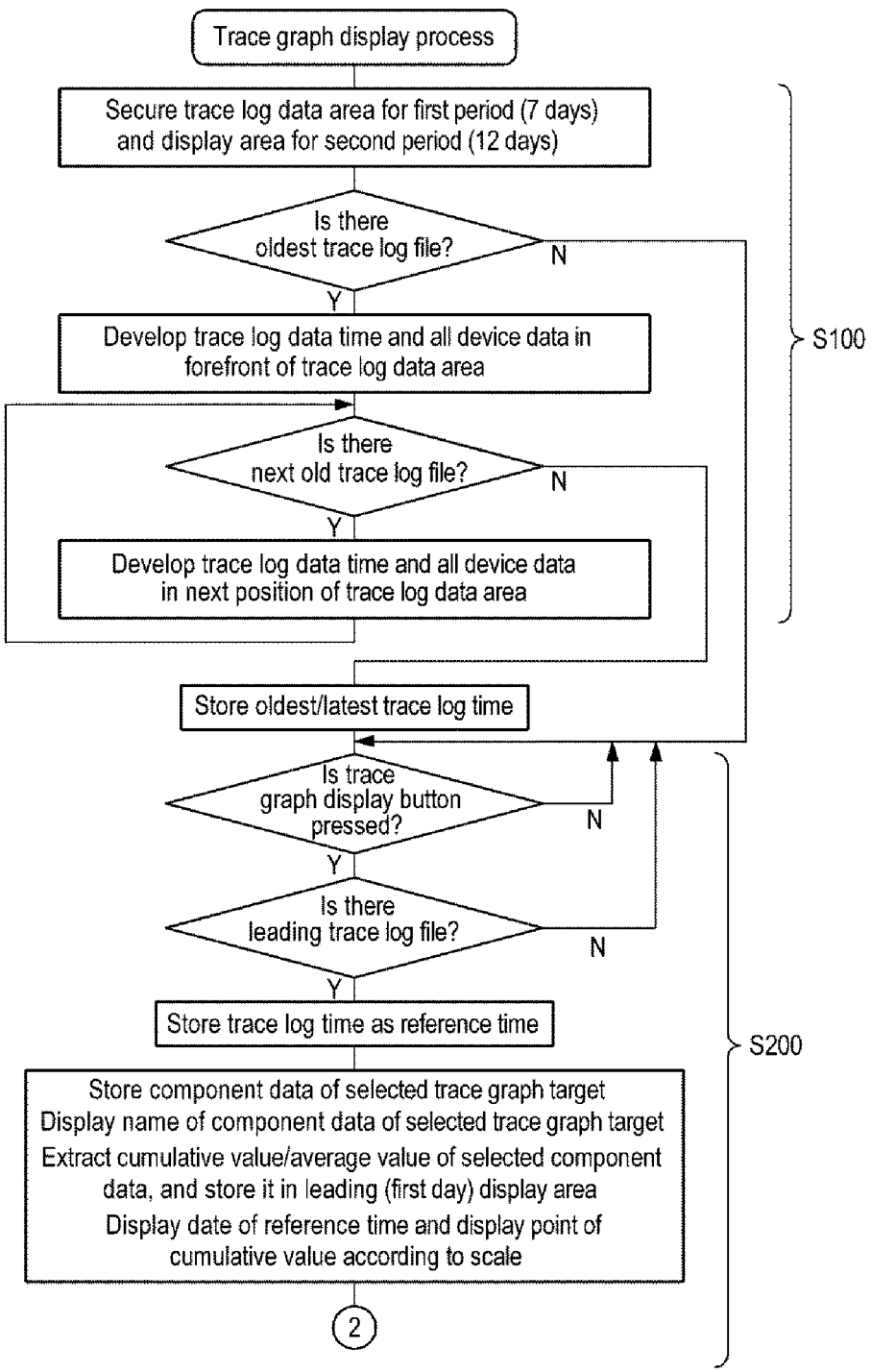
FIG. 9A is a diagram illustrating a process flow of the component management function suitably used in the substrate processing apparatus according to the present disclosure.

Next, FIGS. 7 to 9 are flowcharts illustrating process flows of the component management function of the substrate processing apparatus 1 of the present embodiment. It is configured such that at least a sequence for realizing the component data collection function illustrated in FIG. 7, a sequence for realizing the component data display function illustrated in FIG. 8, and a sequence for realizing the graph display function illustrated in FIG. 9 are executed. However, only one component management program is executed, and FIGS. 7 to 9 only show the sequences in a state specified for the functions, and the overlapping description will be omitted. It is also configured such that a screen transition program for performing the switching display of screens illustrated in FIG. 10 and subsequent drawings as described hereinbelow is executed.

FIG. 7 illustrates an example of a sequence for realizing the component data collection function which is one of the component management functions, in which the sequence is configured to be executed by the component management data control section 225.

(S1: Initial Preparation Step)

First, the component management data control section 225 reads a component data initial parameter file that defines the component data to be collected from the storage section 222 in advance and develops it in the memory 226. Here, an area of a cumulative value and an average value of all component data is secured in the data accumulation part 502, and the latest trace log file is developed in that area and stored in the data accumulation part 502.

(S2: Initial Data Storage Step)

The component management data control section 225 checks whether the device data is transmitted from the process system controller 212 or the transfer system controller 211, as the control part controller. Upon receiving a data message including the device data, the component management data control section 225 checks whether the device data included in the data message is the device data related to the maintenance component, extracts the device data as the component data, and stores the extracted component data in the data accumulation part 502. On the other hand, if the device data is not related to the maintenance component, the component management data control section 225 similarly checks a relation with the maintenance component for next device data. When there is no device data, the component management data control section 225 again checks whether or not the data message is received from the control part controller.

(S3: Data Collection Step)

The component management data control section 225 checks reception of the data message from the control part controller and also checks whether the device data is component data related to the maintenance component. If there is any component data, the component management data control section 225 compares it with the component data stored in the data accumulation part 502. The data calculation part 503 integrates data changes according to the component data, or counts up the number of times (or time) to calculate a component data cumulative value. The component management data control section 225 causes the data determination part 504 to compare the component data cumulative value with a predetermined threshold values, and when it exceeds the threshold value, the component management data control section 225 causes the data update part 505 to retain the component data cumulative value and the current time as a threshold value arrival time in the data accumulation part 502. In this manner, the next device data is extracted, and the checking of the component data and the comparison of the component data are performed in the same manner. When there is no device data, it also waits to receive the device data from the control part controller.

On the other hand, when it is not necessary to compare with the component data stored in the data accumulation part 502, for example, even when there is any component data but there is no change in the data, such as being not necessary to calculate the component data cumulative value, the component management data control section 225 performs the comparison by the data determination part 504. When it is not necessary to compare the component data, next device data extraction may be checked without comparing the data. Furthermore, this component data comparison function is configured to be automatically executed according to the operation of the operation part 201.

FIG. 8 illustrates an example of a sequence for realizing the component data display function which is one of the component management functions, in which the sequence is configured to be executed by the component management data control section 225.

(S10: Initial Preparation Step)

First, the component management data control section 225 reads a component data initial parameter file that defines the component data to be collected from the storage part 222 in advance and develops it in the memory 226. Specifically, the component management data control section 225 is configured to secure an area of a cumulative value and an average value of all component data in the data accumulation part 502, develops the latest trace log file in that area, stores it in the data accumulation part 502, and also to secure an area of the maintenance component list storing the component data and the maintenance component list for display in the data accumulation part 502. In addition, the component management data control section 225 stores the current time as a reference time in the area, and monitors the time. It is also configured such that the updating of the component data is performed for a predetermined cycle (for example, one day). In the present embodiment, description will be made on the premise that the component data is updated every day.

Furthermore, when the reference time reaches an update time, the component management data control section 225 causes the data calculation part 503 to calculate an average value of the component data. Then, a cumulative value and an average value of all component data to be displayed, and the current time are stored in an area for the trace graph display, and the cumulative value and the average value of all component data to be displayed, and the current time are stored as a trace log file in the data accumulation part 502.

(S20: Replacement Time Calculation Step)

The component management data control section 225 extracts component data on the maintenance components of the maintenance component list, updates an effective number of days up to a threshold value indicating a replacement time of the component data, and stores it as an effective day number reference value. Next, the component management data control section 225 extracts component data related to the maintenance components, causes the data calculation part 503 to calculate an effective number of days until reaching the threshold value as the replacement time based on the cumulative value and the average value of the component data, and causes the data determination part 504 to compare the calculated effective number of days with the effective day number reference value to determine a shorter one by the replacement time. Then, the component management data control section 225 causes the data update part 505 to update the effective day number reference value as necessary. The component management data control section 225 causes the data determination part 504 to compare the effective numbers of days (the numbers of days until reaching the replacement time) for all the component data related to the maintenance components of the maintenance component list and causes the data update part 505 to register the earliest effective number of days as the effective day number reference value in the component maintenance list for display. The component management data control section 225 causes the data update part 505 to register the earliest effective number of days as the effective day number reference value in the component maintenance list for display in the same manner for all the maintenance components in the maintenance component list, and repeats it until the registration is completed.

Here, this flowchart is configured to calculate and manage a lifetime even for each component data although there is a plurality of component data so as to cope with the case of a mechanism in which the leading maintenance component is configured with a plurality of components (for example, the pod transfer mechanism 15, the wafer transfer mechanism (substrate transfer mechanism) 24, the boat 26, and the rotation mechanism (not shown)).

(S30: Replacement Time Comparison Step)

When the effective day number reference value is calculated at least for the maintenance components (the maintenance components of the maintenance component list for display) to be displayed, the component management data control section 225 is configured to cause the data determination part 504 to compare the effective day number reference values and cause the data update part 505 to arrange the maintenance components in ascending order of the effective day number reference values from the top of the component list for display. The component management data control section 225 is also configured to control the screen control part 520 that displays the maintenance components in the order of registration in the component list for display.

With this configuration, when displaying the maintenance component management main screen (FIG. 10), which will be described later, the maintenance components can be displayed from the top, sequentially from the maintenance component having the closest replacement time. Accordingly, it is possible to predict the replacement time of the maintenance components and present the recommended replacement date and time. In addition, since the threshold value can be managed for a plurality of conditions for each maintenance component, the reliability of the replacement time to be predicted can be improved, thereby reducing wasteful component replacement cost.

Furthermore, since the component data of the maintenance components can be referred to by displaying the maintenance component management main screen (FIG. 10) which will be described later, it is possible to efficiently provide the maintenance component that reaches the threshold value recommended for maintenance or replacement.

FIG. 9 illustrates an example of a sequence for realizing the trace graph display function of component data which is one of the component management functions, in which the sequence is configured to be executed by the component management data control section 225.

(S100: Display Preparation Step)

First, the component management data control section 225 reads the component data initial parameter file that defines the component data to be collected from the storage part 222 in advance and develops it in the memory 226. Specifically, the component management data control section 225 secures an area of a cumulative value and an average value of all the component data in the data accumulation part 502, develops the latest trace log file in that area and stores it in the data accumulation part 502, and also secures an area of the maintenance component list storing the component data and the maintenance component list for display in the data accumulation part 502. Furthermore, the component management data control section 225 secures a trace log area of a first predetermined period (for example, 7 days) and a display area of a second predetermined period (for example, 12 days) in the data accumulation part 502.

The component management data control section 225 searches for the oldest trace log file for the first predetermined period, and terminates the display preparation step when there is no oldest trace log file. When there is the oldest trace log file, the trace log time and all the device data are developed in the forefront of the trace log data area. The component management data control section 225 repeatedly searches for it up to the latest trace log file, develops the latest trace log file from the oldest trace log file, and secures the trace log time and all the device data in the trace log data area of the data accumulation part 502. Also, the oldest to latest trace log times are stored in the data accumulation part 502. It waits until there is an instruction to display the trace graph.

(S200: Trace Data Display Step)

The component management data control section 225 checks the presence or absence of the oldest trace graph (leading trace graph) file. When there is no file, it returns to the standby state. Here, the absence of the leading trace log file indicates a state in which the component data updating process has never been executed after driving the control system 240 (or the operation part 201), and it is configured to check in advance what is displayed as the trace graph. For example, when there is no file, the component management data control section 225 may be configured to control the screen control part 520 to cause a button for displaying the trace log to transition to a pressing prohibition state while generating an alarm.

When there is the file, the component management data control section 225 first stores the trace log time as the reference time in the data accumulation part 502. In addition, the component management data control section 225 stores the selected component data of the trace graph target in the data accumulation part 502 and causes the screen control part 520 to display the name of the selected component data of the trace graph target. Furthermore, the cumulative value and the average value of the selected component data are extracted and stored in the leading display area. In addition, the component management data control section 225 causes the screen control part 520 to display the date of the reference time and also to display the point of the cumulative value according to the scale.

The component management data control section 225 adds one day to the reference time and then checks whether the log time of the trace log file coincides with it or not. If they do not coincide with each other, it copies the cumulative value and the average value of the selected component data from the data of the previous day and stores them in the display area of the added cumulative day, and also displays the date of the reference time on the graph display part 510. For example, when the power source of the control system 240 is left in an OFF state for two days and the power becomes ON after three days, since the data display process is made three days later and thus the trace log of the date does not exist when the power was OFF, it is configured to check the status.

When the reference time and the log time coincide with each other, the component management data control section 225 is configured to extract the cumulative value and the average value of the selected component data from the trace log data and store them in the display area of the added cumulative date, and also to display the date of the reference time on the graph display part 510, display the point of the cumulative value according to the scale and display a line connecting the previously displayed point. The component management data control part is configured to repeat until the reference time exceeds the earliest log time, and to perform the same display process on the graph display part 510.

(S300: Predictive Data Display Step)

Then, when the reference time exceeds the earliest log time, the component management data control section 225 causes the data calculation part 503 to copy the cumulative value of the selected component data from the data of the previous day, to copy the average value from the data of the previous day, and to calculate an expected value of the cumulative value from the average value. The average value for calculating the expected value may also be an average value of all the average values up to the previous day. Then, it is configured such that it is stored in the display area of the added cumulative day, the date of the reference time is displayed on the graph display part 510, the point of the cumulative value is displayed according to the scale, and the line connecting the previously displayed point is displayed. It may be configured such that the method of calculating the average value for calculating the expected value of the cumulative value, in addition to the above, appropriately selects the data of the first predetermined period (for example, seven days) up to the previous day and causes the data calculation part 503 to average it.

The component management data control section 225 is configured to be repeated, and perform the predictive data display step until the reference time exceeds the second predetermined period (12 days).

According to the present embodiment, since the component data of the maintenance components can be graphically displayed on the time axis, the maintenance time can be predicted on the operation screen from the increasing tendency of the monitored values of the components to be monitored, thereby preparing maintenance components in advance.

Examples

An example that is applied to the aforementioned substrate processing apparatus 1 suitably used in the present embodiment will be described with reference to FIGS. 10 to 16 illustrating the respective screens displayed on the display part 218 by executing the component management program by the operation part 201.

FIG. 10 which is an exemplary example of the maintenance component list screen to be displayed will be described. In FIG. 10, a list of maintenance components is displayed as a maintenance component management function main screen as a maintenance component management screen by executing the component management program by the operation part 201. This FIG. 10 is displayed by pressing a predetermined start button in the operation part 201. Among the components constituting the substrate processing apparatus 1 or a mechanism configured with a plurality of components, the mechanism or the components selected as maintenance components are mainly displayed in a list. When a button (hereinafter, also referred to as a status display button) 601 for displaying the replacement time of the maintenance components is pressed, the screen is configured to transition to a maintenance component management data detailed screen of FIG. 12 as described hereinbelow, and when a button (hereinafter, also referred to as a component maintenance button) 602 for displaying the replacement history of the maintenance components is pressed, the screen is configured to transition to a maintenance component management replacement execution screen of FIG. 15 as described hereinbelow.

For the status of each maintenance component, it is configured to display the status of the condition having the smallest number of remaining days with respect to a set threshold value among all the component data affecting the replacement time in the status display button 601.

Specifically, the screen control part 520 is configured to display the status display button 601 on the maintenance component management screen in a color-coded manner, according to the earliest replacement time, among the replacement times calculated for the component data of the mechanism and each of the components constituting the mechanism.

The screen control part 520 is configured to display "time limit reached" when the replacement time of the component data exceeds the threshold value on the status display button 601, to display "date exceeding the threshold value" when the replacement time of the component data is less than 1 year up to the threshold value, and to display "good" when the replacement time of the component data is 1 year or more up to the threshold value. In the present embodiment, it is also configured such that the status display button 601 is displayed in yellow when it is less than 90 days up to the threshold value, and is displayed in red when it is less than 30 days up to the threshold value.

When a non-display item button 603 displayed on the maintenance component management screen is pressed, the screen control part 520 is configured to display information on maintenance components not to be displayed that has leaked out of the maintenance component list. In addition, this non-display button is also displayed in a color-coded manner as the same with the status display button 601, depending on the number of days until the replacement time of the component data of the maintenance components, which are not to be displayed, illustrated in FIG. 11 as described hereinbelow, reaches the threshold value.

When an item number button 604 displayed on the maintenance component management screen is pressed, the screen control part 520 is configured to display a dialog box for determining whether or not to display the maintenance components to be displayed.

Figure 11:
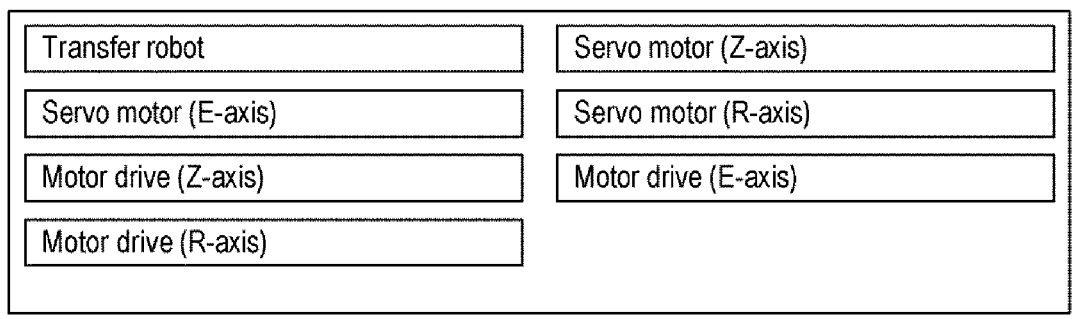
FIG. 11 is an exemplary example illustrating the component management function suitably used in one embodiment of the present disclosure.

A non-display item list screen for displaying a list of maintenance components which are not to be displayed is illustrated in FIG. 11. In this screen, when a button of a maintenance component item to be returned to the display state is pressed, it is configured to return into (to be displayed as) the maintenance component management screen by the screen control part 520. However, since it is the maintenance target even if it is in the non-display state, the monitoring of the component data is performed. Similar to the status display button on the maintenance component management screen, it is configured such that the button of the maintenance component item displayed in FIG. 11 is displayed in a color-coded manner according to the number of days until the time (replacement time) when the cumulative value of the component data reaches the threshold value.

When the status display button 601 on the maintenance component management function main screen is pressed, the screen control part 520 is configured to switch to the maintenance component management data detailed screen for displaying all the component data affecting the replacement time of the selected maintenance components so as to be displayed.

The status of each condition is displayed in the same rule as the main screen on the component data detailed display screen illustrated in FIG. 12. When a threshold value display button 611 in this screen is pressed, a soft keyboard can be displayed to change the threshold value. When a data trace button 612 on this screen is pressed, relevant component data as described hereinbelow is displayed in the aforementioned trace graph. When a replacement history button 613 in this screen is pressed, a change history detailed data screen as described hereinbelow is displayed.

First, the maintenance component management data detailed screen illustrated in FIG. 12 will be described. In FIG. 12, a vacuum robot is selected as the maintenance component in FIG. 10, and when the status display button 601 corresponding to the vacuum robot is pressed, it is configured to be displayed by the screen control part 520. Items on the upper side of FIG. 12 are items indicating the status related to the vacuum robot, in which use start date and time, use period date and time, and a lifetime (number of days) recommended by the component maker (300 days in this case) are set. Then, it is understood that the effective number of days until expiration date and time indicating the replacement time is 291 days. An item 611 of the threshold value as the lifetime (days) may be made to selectively and appropriately set numerical data.

Next, FIG. 12 shows that four device data are related to the vacuum robot as the maintenance component. In the present embodiment, the device data related to such a maintenance component is referred to as component data. In the present embodiment, for each component data, the effective number of days until the use period date is calculated such that the replacement time can be predicted.

Hereinafter, details of the X-axis total drive pulses as the name of the component data will be described. The current value which is the cumulative value of the component data up to now is 50, the average value for a predetermined cycle (for example, one day) is 5.5, and the threshold value recommended by the component maker is 1,000. Thus, a value calculated based on the current value "50" and the average value "5.5" which is the average of one day in the present embodiment until the threshold value 1000 is reached is 191, and the effective number of days is 191 as it is. Therefore, the expiration date indicating the replacement time shows that it is Sep. 4, 2016 which is the 191st day from the current time. For example, when calculating the Y-axis total drive pulses in the same manner, since the effective number of days is 46 days, it can be seen that the use period date is Apr. 12, 2016 which is the 46th day from the current time. Also, since the effective number of days is less than 90 days, the items of the use period date and the effective number of days are displayed in a color-coded manner. The item 611 of the threshold value (pulses) may be made to appropriately set numerical data.

Furthermore, since the name of the component data indicates that the effective number of days is 0 day for the R-axis total drive pulses, it can be seen that the current value has already reached the threshold value. In this case, it is configured such that the replacement time at which the current value reaches the numerical value set by the threshold value is displayed in time at the use period date. In this manner, the replacement time was determined by the value (300 days) recommended by the maker of the transfer robot so far. However, in the present embodiment, it is possible to estimate a true replacement time of the transfer robot by setting the threshold value in each components constituting the transfer robot and determining the replacement time of each component. Furthermore, it is possible to display the history until the replacement time is reached by the trace graph as described hereinbelow.

Next, when the data trace button 612 illustrated in FIG. 12 is pressed, it is configured such that the screen is switched to a trace graph display screen illustrated in FIG. 13 so as to be displayed. Here, FIG. 13 will be described.

Figure 13A:
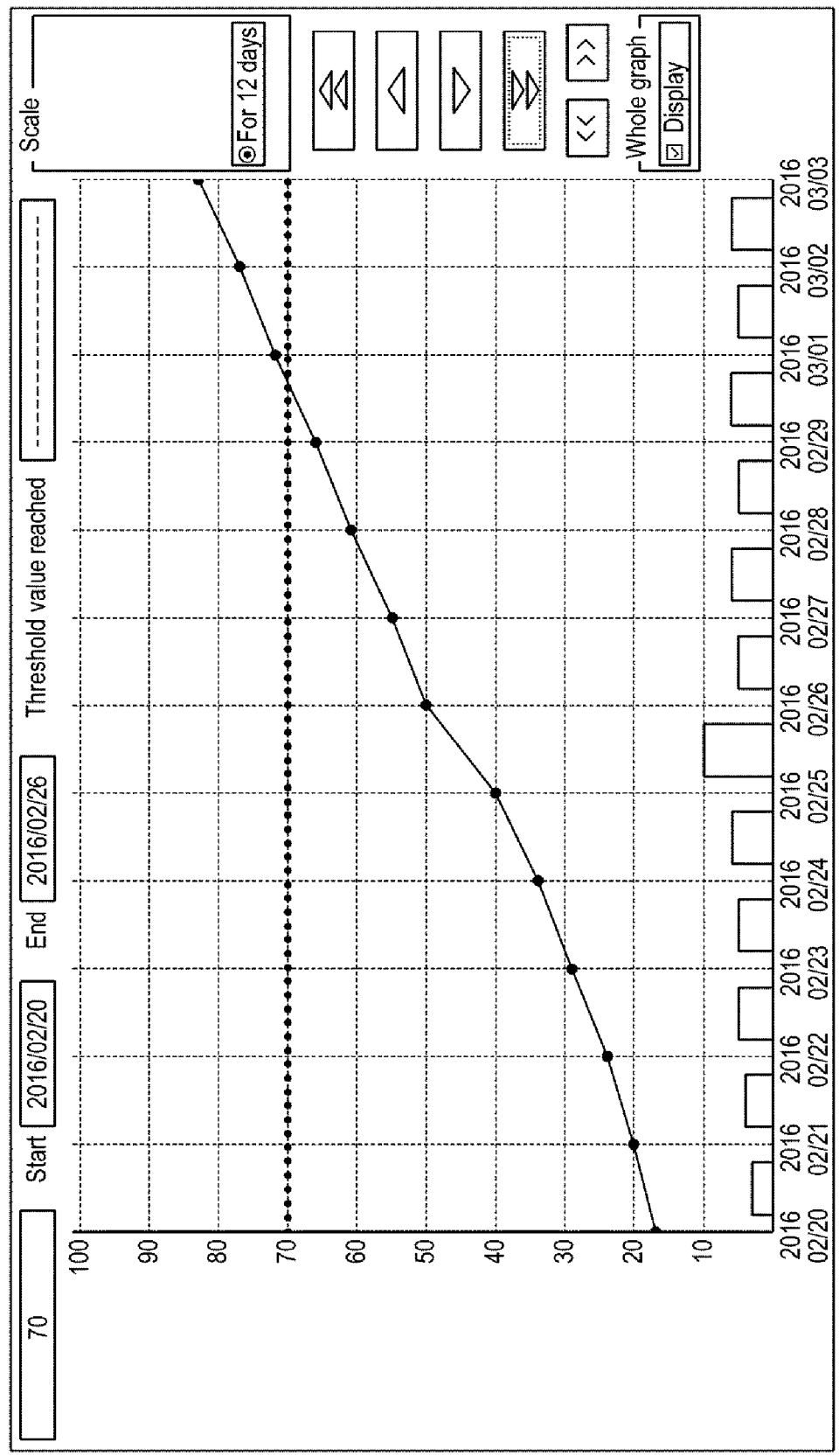
FIG. 13A is an exemplary example illustrating the component management function suitably used in one embodiment of the present disclosure.
Figure 13B:
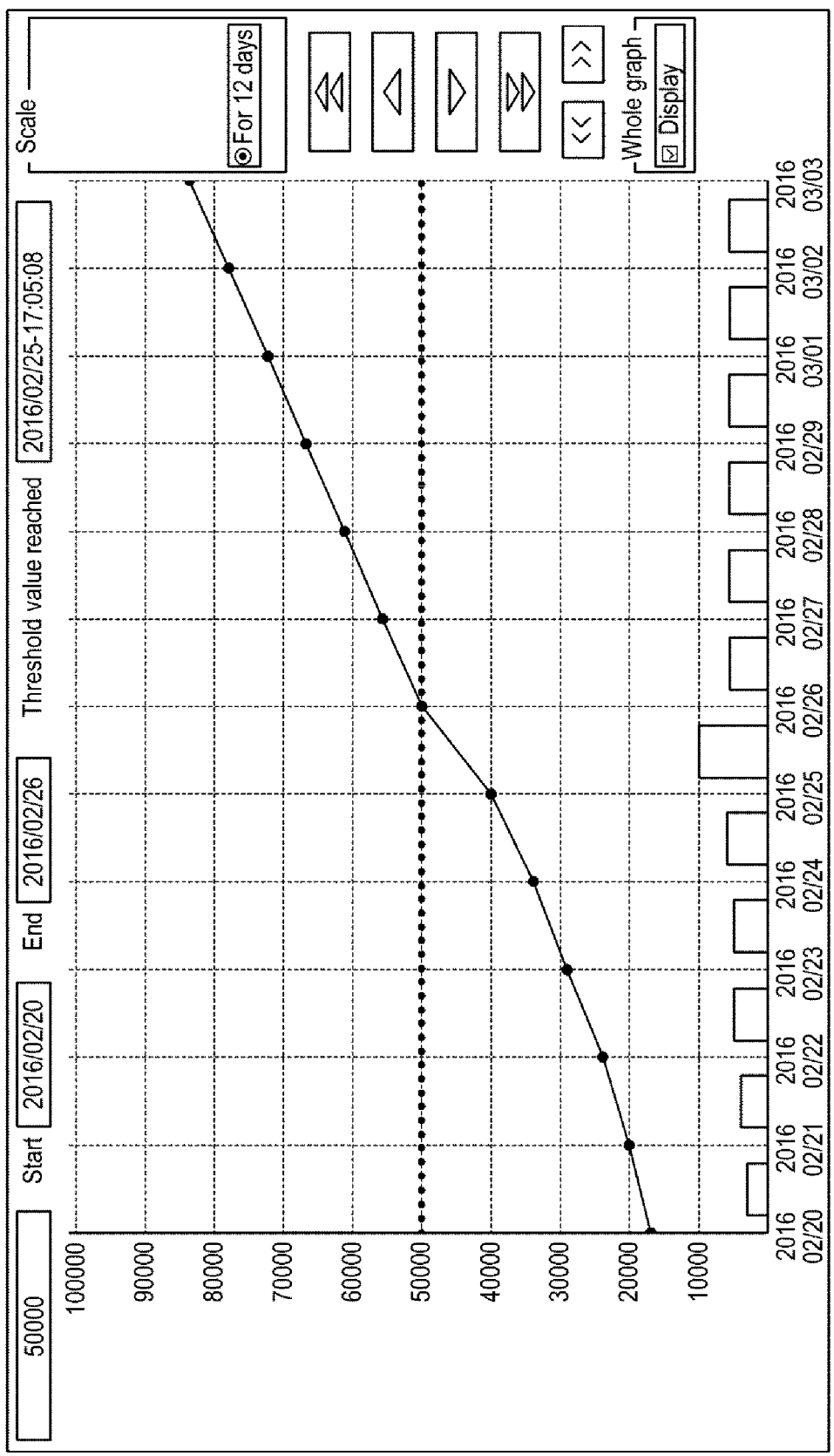
FIG. 13B is an exemplary example illustrating the component management function suitably used in one embodiment of the present disclosure.

In FIG. 13A, when the data trace button related to the X-axis total drive pulses is pressed, it is configured such that the name of the component data in FIG. 12 is switched to the display part 218 by the screen control part 520 so as to be displayed. In FIG. 13B, when the data trace button related to the R-axis drive pulses is pressed, it is configured such that the name of the component data in FIG. 12 is switched to the display part 218 by the screen control part 520 so as to be displayed.

Next, it is configured such that a cell indicating a threshold value (70), a start cell indicating a trace start date (2016 Feb. 20), an end cell indicating a trace end date (2016 Feb. 26), and a threshold value arrival cell indicating a threshold value arrival time are displayed on the upper side of the trace graph illustrated in FIG. 13A. Furthermore, since the X-axis total drive pulses have not reached the threshold value, the threshold arrival cell is blank. Since the vertical axis is the number of pulses and the threshold value is 70 pulses, the dotted line of 70 pulses is highlighted on the trace graph.

After the trace end date (2016 Feb. 26), the step of S300 in FIG. 9 is executed by the graph display part 510. For example, the average value of the average values of the respective predetermined cycles (one day) from the trace start date (2016 Feb. 20) to the trace end date (2016 Feb. 26) is added to the cumulative value of the trace end date (2016 Feb. 26) to calculate an cumulative value of the day (2016 Feb. 27) following the trace end date. Similarly, the cumulative value is calculated by repeating until 2016 Mar. 3 after the second predetermined period (for example, 12 days). Similarly, the cumulative value is calculated by repeating until 2016 Mar. 3 after the second predetermined period (for example, 12 days). Thus, it is understood that the threshold arrival date of the X-axis total drive pulses is the 2016 Feb. 29 day. In this manner, it is possible to estimate replacement times, particularly for the maintenance components that have not reached the threshold value.

It is configured such that the second predetermined period (12 days) can be selected as the scale at the right end of the trace graph. In the drawing, there is only one scale, but it is not limited thereto. In addition, the vertical scale may be changed by the up and down arrows, and the horizontal axis may be switched by the left and right arrows.

Furthermore, for example, as illustrated in FIG. 13, it is configured such that the actually measured values at predetermined intervals (one day) are displayed in a bar graph by the screen control part 520 by selecting whether or not to display the bar graph on the right side.

Next, it is configured such that a cell indicating a threshold value (50,000), a start cell indicating trace start date and time (2016 Feb. 20), an end cell indicating trace end date and time (2016 Feb. 26), and a threshold value arrival cell indicating a threshold arrival time (2016 Feb. 25-17:05:08) is displayed on the upper side of the trace graph illustrated in FIG. 13B. In this case, since the cumulative value of the component data (R-axis total drive pulses) of the maintenance component (transfer robot) reaches the threshold value, it is configured such that the time when it reaches the threshold value arrival cell is specified. Thus, since the R-axis drive already exceeds the threshold value, it is understood that it should be promptly replaced or maintained.

In FIG. 14, when the replacement history button 613 related to the R-axis total drive pulsed is pressed, it is configured such that the name of the component data in FIG. 12 is switched to the display part 218 by the screen control part 520 so as to be displayed. Furthermore, FIG. 14 is a diagram illustrating the present embodiment, and unlike the actual screen, there are portions where the specified numerical values do not make sense.

In FIG. 14, it is configured such that the use start date and time (2016 Feb. 26-18:17:18), the data name (R-axis total drive pulses) which is the name of the component data, the number of replacements (14), and the data average value (1094023) are displayed.

In FIG. 14, it is also configured such that the component data at the time of replacement in the past ten times is displayed in old order from item No. 1 with respect to the data name (R-axis total drive pulses). It is configured such that the latest data at the time of replacement is displayed at item No. 10. The reason for replacing items No. 1 to No. 4 is based on regular replacement, but the reason for replacing items No. 5 to No. 10 is due to failure. In addition, when exceeding the threshold value at the time of replacement, the date and time exceeding the threshold value is specified in the threshold arrival date and time column. Furthermore, the data column indicates a cumulative value of the component data at the time of replacement. The data average value described above indicates an average value of the data values at the time of replacement in the past ten times.

In this manner, it is possible to analyze the average data value at the time of replacement and the past replacement factors, and to propose the component change to the component maker.

When the component maintenance button 602 on the maintenance component management function main screen illustrated in FIG. 10 is pressed, the screen control part 520 is configured to switch to a maintenance component management replacement execution screen displaying data related to the replacement history of the selected maintenance component so as to be displayed.

In FIG. 15, when the replacement of the maintenance components actually selected in FIG. 10 is completed, it is configured such that it can be displayed by depressing the component maintenance button 602 on the maintenance component management function main screen. If the replacement factor is due to regular maintenance, when a replacement (regular) button 621 is pressed, it can be displayed by the screen control part 520, while in the case of replacement due to a failure, when a replacement (failure) button 622 is pressed, it can be displayed by the screen control part 520.

On this screen (FIG. 15), the latest replacement date and time (2021 Jun. 22-17:05:08) and the total number of replacements in the past (13) are displayed, and the latest 10 times replacement date and time and the component data at the time of replacement are accumulated. If it has already been replaced more than 10 times, it will be deleted from the oldest history. In addition, it is configured such that only the latest replacement history information can be canceled. This cancel button is configured so as to be pressed in the case of an erroneous operation of the replacement factor at the time of the component replacement completion operation. The cancel button is also configured to store data other than the latest data and add it to the latest replacement history information so as not to delete the accumulated data up to that point.

When an ESC button is pressed, the maintenance component management function main screen illustrated in FIG. 10 is again displayed. Furthermore, when the component data button is pressed, a maintenance component management whole data display screen as described hereinbelow is displayed.

Next, in FIG. 16, it is configured such that replacement date and time of maintenance components and a cumulative value of all component data at the time of replacement of maintenance components are displayed.

According to this example, by displaying the screen for managing the maintenance components and providing the detailed information on the component data in this manner, since the service department (or service company) of the semiconductor manufacturing apparatus maker replaces the whole transfer device, for example, in order to shorten the stop period of the device operation for the overhaul of the transfer device, the service department (or service company) of the device maker may be requested in advance to prepare for overhaul.

There was a problem that the component replacement and maintenance are set based on an elapsed time after the operation of the apparatus up to now and determination was not made by the numerical value based on the operation status of the components such as the moving distance of the axis. However, in the present embodiment, the device administrator can check the mechanism configured with the maintenance components whose component data exceeds the threshold value by referring to the main screen (FIG. 10) or the like of the maintenance component management function, and determine the replacement or maintenance by looking at specific numerical values including the operation status of the device in addition to the elapsed time.

Other Embodiments

In the present embodiment, since the mechanism configured with the maintenance components as targets is different depending on a difference of configuration between the vertical type apparatus and the single-wafer apparatus, the selected maintenance components are merely different but the technical spirits of the present disclosure are the same.

For example, although the transfer robot 24 has been described as an example, the component management function of the present embodiment may be applied to a transfer mechanism that transfers a substrate used in the single-wafer apparatus. In other words, the component management function of the present embodiment may be applied to components composed of components used in the single-wafer apparatus, a mechanism configured with a plurality of components, a plurality of mechanisms, or a unit configured with a combination of components and mechanisms or the like.

Therefore, in the present embodiment, it is to be understood that the effects of achieving the stable operation of the substrate processing apparatus by recognizing the maintenance timing of the components of the substrate processing apparatus are the same whether the substrate processing apparatus is the vertical type apparatus or the single-wafer apparatus.

As described above, according to the present embodiment, at least one or more of the following effects (a) to (e) may be achieved.

(a) According to the embodiment, by comprehensively managing a plurality of different use status data (component data) and a threshold value for one replacement component (maintenance component) and presenting date and time at which a threshold value is firstly reached based on the number of times of use (average, moving average, or the like) as the replacement date and time among all the use status data (component data), it is possible to improve the reliability.

(b) According to the embodiment, by presenting the replacement time at the date and time using a warranty period or a guaranteed number of times of use provided by the component maker as the threshold value based on the number of times of use per day as well as the cumulative number of times, and supporting the user's planned stop of the device and components replacement, it is possible to improve the operating ratio.

(c) According to the embodiment, it is possible to display the history of factors, date and time, cumulative data, or the like at the time of component replacement. Thus, the failure rate can be recognized, and when the failure rate is high, it is possible to submit a proposal such as switching of the component makers or the like, to prevent sudden stop of the device, and to improve the operating ratio.

(d) According to the embodiment, conventionally, there was a problem that the component replacement or maintenance is set based on the elapsed time after the operation of the device, and is not determined by numeral values based on the operation status of components such as the number of pulses of the axis. However, in the present embodiment, the device maker apparatus administrator recognizes a maintenance component or a mechanism whose component data exceeds the threshold value by referring to the main screen of maintenance component management. In this manner, the device maker apparatus administrator can determine the replacement or maintenance by referring to the main screen of maintenance component management and looking at specific numerical values including the operation status of the device in addition to the elapsed time.

(e) According to the embodiment, the service engineer of the device maker can submit a proposal for device management service, for example, by referring to the component data of the maintenance components after the failure countermeasure, displaying the graph, and looking at the tendency of the component data. In addition, it is possible to optimize the stock by intentionally preparing only maintenance components close to the replacement time. Furthermore, it is possible to make a proposal to reduce the number of stops of the device by collecting and replacing or maintaining maintenance components whose replacement or scheduled maintenance dates are close.

Moreover, in the present disclosure, the component management program (component management function) is incorporated in the operation part 201, but it may be configured such that a data collection controller is installed separately from the operation part 201 so as to cause the controller to execute the component management program. In this case, as an example, the functional configuration is configured to include, for example, a communication part that transmits and receives various data to and from the operation part 201, a device data control part which receives device data transmitted from the substrate processing apparatus via the communication part, refers to the received data and updates the component data in the case of the component data related to the maintenance component out of the device data, and a display data control part which processes the component data into data for screen display and updates the screen display data. Furthermore, it has a function of a database that collects the device data, and may further have a function of processing each accumulated data using the accumulated component data or device data to create component data and graphing it in time series. The screen display may be replaced by the operation part 201 and a terminal or the like connected for screen reference.

In addition, the component management program (component management function) according to the embodiment of the present disclosure may be incorporated into any controller of the system includes the transfer system controller 211 as the transfer control part, the process system controller 212 as the process control part, and the management device.

The substrate processing apparatus 1 according to the embodiment of the present disclosure may also be applied not only to a semiconductor manufacturing apparatus for manufacturing a semiconductor but also to an apparatus for processing a glass substrate such as an LCD device. It is needless to say that the present disclosure may also be applied to various substrate processing apparatuses such as an exposure apparatus, a lithography apparatus, a coating apparatus, and a processing apparatus using plasma. Furthermore, the present disclosure may also be applied to a process of forming a thin film such as a CVD or a PVD, a process of forming an oxide film or a nitride film, or a process of forming a film containing a metal, in the film-forming process.

The present disclosure can be applied to management of components constituting a substrate processing apparatus for processing a substrate.

According to the present disclosure in some embodiments, it is possible to recognize a maintenance time of components constituting a substrate processing apparatus, and to provide a stable operation of the substrate processing apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising an operation part configured to operate a screen control part, a collection part, a determination part, and a calculation part,
  wherein the screen control part is configured to display, on a display part, a maintenance component management screen displaying one or more components, one or more mechanisms, or both, which are selected as management targets from components constituting the apparatus, mechanisms configured with a plurality of components, or both, as maintenance components,
  wherein the collection part is configured to collect component data related to each of the maintenance components,
  wherein the determination part is configured to, for each of the maintenance components, compare a cumulative value of the component data with a predetermined threshold value to determine whether the cumulative value exceeds the predetermined threshold value,
  wherein the calculation part is configured to repeatedly perform:
    calculating an average value of a plurality of average values of the component data for a predetermined period, each of the plurality of average values of the component data being obtained for a predetermined cycle;
    calculating an expected value of a cumulative value of the component data based on the average value of the plurality of average values of the component data; and
    calculating replacement times estimated for replacing the maintenance components, respectively, by determining the expected value of the cumulative value of the component data exceeds a predetermined threshold value of the component data, wherein the operation part is configured to:
cause the calculation part to calculate the replacement times;
cause the screen control part to display, on the display part, the maintenance component management screen displaying the maintenance components sequentially from a maintenance component having an earliest replacement time among the calculated replacement times to a maintenance component having a latest replacement time among the calculated replacement times; and
cause the screen control part to display, on the display part, each of the maintenance components and the component data related thereto, which are updated for each predetermined cycle, and wherein the act of calculating the average value of the plurality of average values of the component data for the predetermined period includes:
calculating a first average value of a first set of average values of the component data for a first predetermined period; and
calculating a second average value of a second set of average values of the component data for a second predetermined period, the second set of average values partially overlapping the first set of average values.

2. The apparatus of claim 1, wherein the screen control part is configured to display, on the display part, a button for displaying a replacement time of a specific mechanism, which is configured with plural components, as one of the maintenance components, in a color-coded manner on the maintenance component management screen, and
wherein the replacement time of the specific mechanism is an earliest replacement time among replacement times calculated for the plural components of the specific mechanism.

3. The apparatus of claim 1, wherein the screen control part is configured to display, on the display part, a non-display item button on the maintenance component management screen, and when the non-display item button is pressed, the screen control part is configured to display information on a maintenance component that is not displayed on the maintenance component management screen.

4. The apparatus of claim 1, wherein the screen control part is configured to display, on the display part, a button for displaying a replacement time of a specific mechanism, which is configured with plural components, as one of the maintenance components on the maintenance component management screen, and
wherein when the button for displaying the replacement time of the specific mechanism is pressed, the screen control part is configured to display, on the display part, a maintenance component detailed screen, which displays a replacement time of each of the plural components of the specific mechanism and the number of days up to the replacement time while displaying a threshold value and a cumulative value of component data related to each of the plural components.

5. The apparatus of claim 1, wherein the screen control part is configured to display, on the display part, a button for displaying a replacement history of a specific maintenance component among the maintenance components on the maintenance component management screen, and
wherein when the button for displaying the replacement history of the specific maintenance component is pressed, the screen control part is configured to display, on the display part, a maintenance component replacement screen, which displays component replacement information including the number of replacing the specific maintenance component.

6. The apparatus of claim 4, wherein the screen control part is configured to display, on the display part, a data trace button for graphically displaying component data of a specific component among the plural components on the maintenance component detailed screen, and
wherein when the data trace button is pressed, the operation part is configured to cause the screen control part to display, on the display part, a cumulative value of the component data of the specific component on a time axis for a predetermined period of time.

7. The apparatus of claim 6, wherein the screen control part is configured to display, on the display part, a trace graph of the component data of the specific component by displaying a name of the component data, a date of a reference time, and data points of the cumulative value of the component data for each predetermined period of time, which are connected with a line.

8. The apparatus of claim 1, wherein the operation pa is configured to:
cause the collection part to collect component data corresponding to a specific mechanism as one of the maintenance components and each of plural components constituting the specific mechanism, and
cause the determination part to:
compare a cumulative value of the component data calculated by integrating or counting up the component data and a predetermined threshold value for each component data, and
when at least one of the component data exceeds the predetermined threshold value, determine a replacement time of the specific mechanism.

9. The apparatus of claim 1, further comprising a maintenance component list configured to set the one or more components or the one or more mechanisms selected as the maintenance components so as to be displayed,
wherein the operation part is configured to update the maintenance component list to be arranged from the top thereof, sequentially from a maintenance component having an earliest replacement time among the maintenance components, and
wherein the operation part is configured to cause the screen control past to display, on the display past, the maintenance component management screen based on the updated maintenance component list.

10. A controller for an operation part configured to operate a screen control part, a collection part, a determination part, and a calculation part,
wherein the screen control part is configured to display, on a display part, a maintenance component management screen displaying one or more components, one or more mechanisms, or both, which are selected as management targets from components constituting the apparatus, mechanisms configured with a plurality of components, or both, as maintenance components,
wherein the collection part is configured to collect component data related to each of the maintenance components,
wherein the determination part is configured to, for each of the maintenance components, compare a cumulative value of the component data with a predetermined threshold value to determine whether the cumulative value exceeds the predetermined threshold value, wherein the calculation part is configured to repeatedly perform:
  calculating an average value of a plurality of average values of the component data for a predetermined period, each of the plurality of average values of the component data being obtained for a predetermined cycle;
  calculating an expected value of a cumulative value of the component data based on the average value of the plurality of average values of the component data; and
  calculating replacement times estimated for replacing the maintenance components, respectively, by determining the expected value of the cumulative value of the component data exceeds a predetermined threshold value of the component data,
wherein the operation part is configured to:
  cause the calculation part to calculate the replacement times;
  cause the screen control part to display, on the display part, the maintenance component management screen displaying the maintenance component sequentially from a maintenance component having an earliest replacement time among the calculated replacement times to a maintenance component having a latest replacement time among the calculated replacement times; and
  cause the screen control part to display, on the display part, each of the maintenance components and the component data related thereto, which are updated for each predetermined cycle, and
wherein the act of calculating the average value of the plurality of average values of the component data for the predetermined period includes:
  calculating a first average value of a first set of average values of the component data for a first predetermined period; and
  calculating a second average value of a second set of average values of the component data for a second predetermined period, the second set of average values partially overlapping the first set of average values.

* * * * *